(12) United States Patent
Yamagata et al.

(10) Patent No.: US 6,528,824 B2
(45) Date of Patent: Mar. 4, 2003

(54) LIGHT EMITTING DEVICE

(75) Inventors: Hirokazu Yamagata, Kanagawa (JP); Junya Maruyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/892,990

(22) Filed: Jun. 27, 2001

(65) Prior Publication Data

US 2002/0000561 A1 Jan. 3, 2002

(30) Foreign Application Priority Data

Jun. 29, 2000 (JP) ........................................ 2000-197422

(51) Int. Cl.[7] ......................... H01L 27/15; H01L 31/12; H01L 33/00
(52) U.S. Cl. ............................. 257/81; 257/59; 257/72; 257/448; 438/149; 438/22
(58) Field of Search ............................ 257/59, 448, 71, 257/72, 92, 81; 438/48, 128, 149, 151, 157, 283, 22

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 4,950,950 A | 8/1990 | Perry et al. |
| 5,047,687 A | 9/1991 | VanSlyke |
| 5,059,861 A | 10/1991 | Littman et al. |
| 5,059,862 A | 10/1991 | VanSlyke et al. |
| 5,061,617 A | 10/1991 | Maskasky |
| 5,073,446 A | 12/1991 | Scozzafava et al. |
| 5,151,629 A | 9/1992 | VanSlyke |
| 5,294,869 A | 3/1994 | Tang et al. |
| 5,294,870 A | 3/1994 | Tang et al. |
| 5,962,962 A | 10/1999 | Fujita et al. |

FOREIGN PATENT DOCUMENTS

| | | |
|---|---|---|
| EP | 0 717 445 | 6/1996 |
| JP | 08-078159 | 3/1996 |
| JP | 08-241048 | 9/1996 |
| JP | 10-189252 | 7/1998 |

OTHER PUBLICATIONS

JP 08–078159 English abstract.
JP 08–241048 English abstract.
JP 10–189252 English abstract.
U.S. patent application No. 09/661,022 (pending) to Yamazaki et al. including PTO filing receipt, specification, claims, abstract, and drawings.
U.S. patent application No. 09/735,096 (pending) to Nishi et al. including PTO filing receipt, specification, claims, abstract, and drawings.
U.S. patent application No. 09/848,233 (pending) to Yamazaki et al. including PTO filing receipt, specification, claims, abstract, and drawings.
U.S. patent application No. 09/921,219 (pending) to Ohtani et al. including PTO filing receipt, specification, claims, abstract, and drawings.

*Primary Examiner*—David Nelms
*Assistant Examiner*—Andy Huynh
(74) *Attorney, Agent, or Firm*—Cook, Alex, McFarron, Manzo, Cummings & Mehler, Ltd.

(57) ABSTRACT

In a light-emitting device wherein a light shield portion is disposed in touch with a transparent electrode included in a pixel, the light shield portion (105 in FIG. 1) is disposed at the peripheral part of the transparent electrode (101), whereby that part of light (visible light) emitted in an EL layer (102) which escapes from the peripheral part of the transparent electrode (101) can be intercepted or reflected. Thus, the loss of the light emitted in the EL layer (102) and the leakage thereof to an adjacent pixel can be prevented, and the efficiency of deriving the light can be sharply heightened.

63 Claims, 12 Drawing Sheets

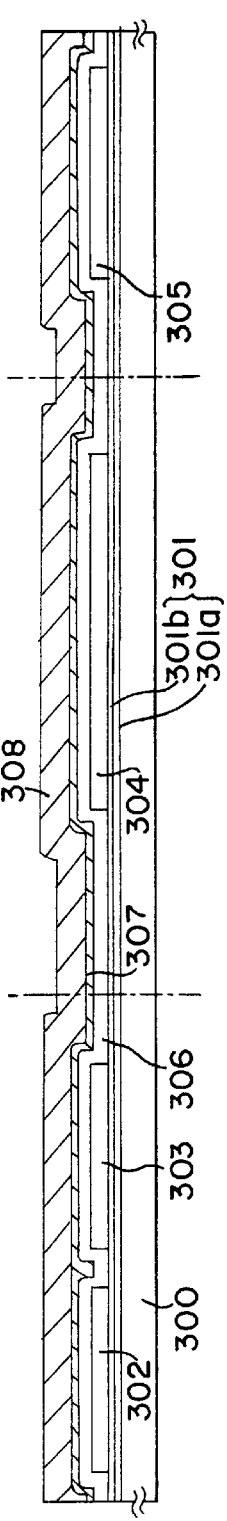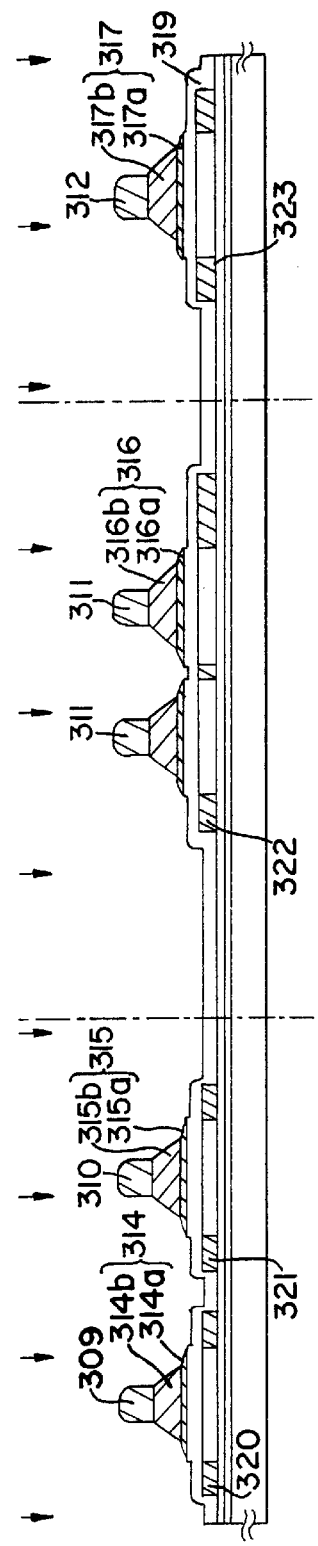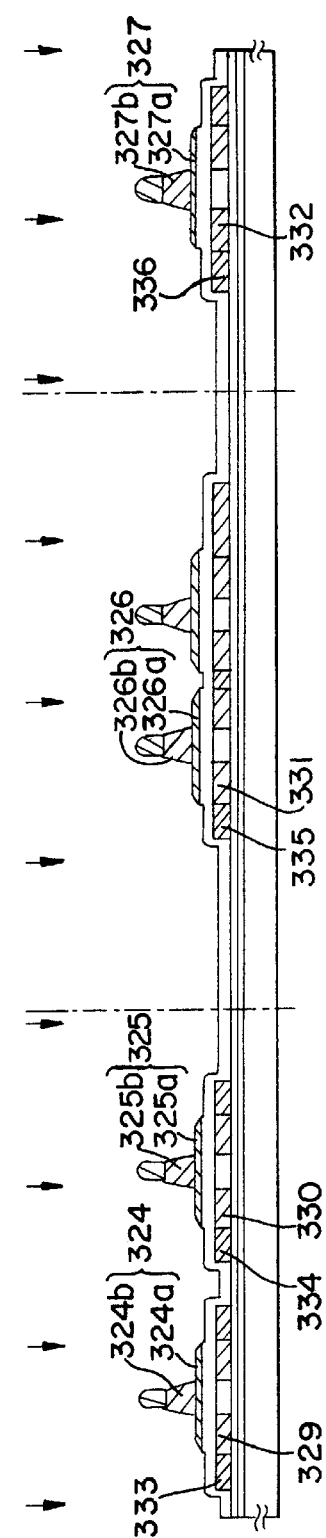

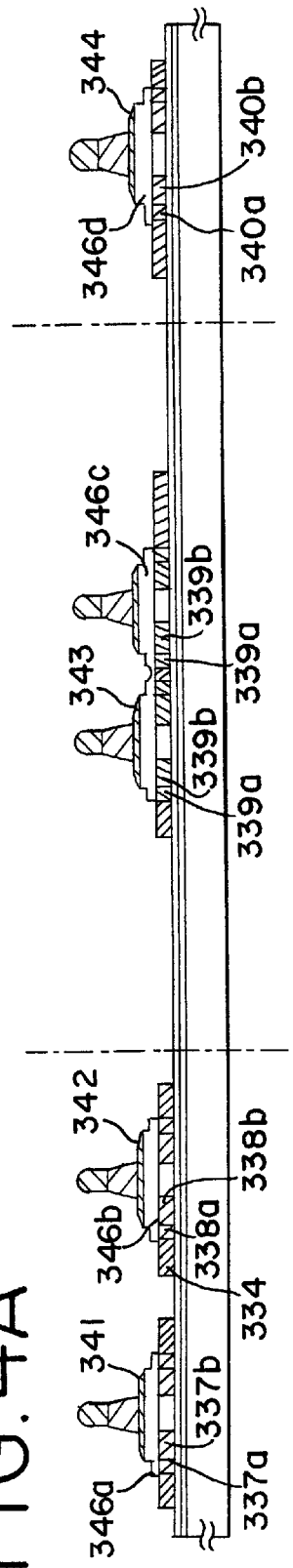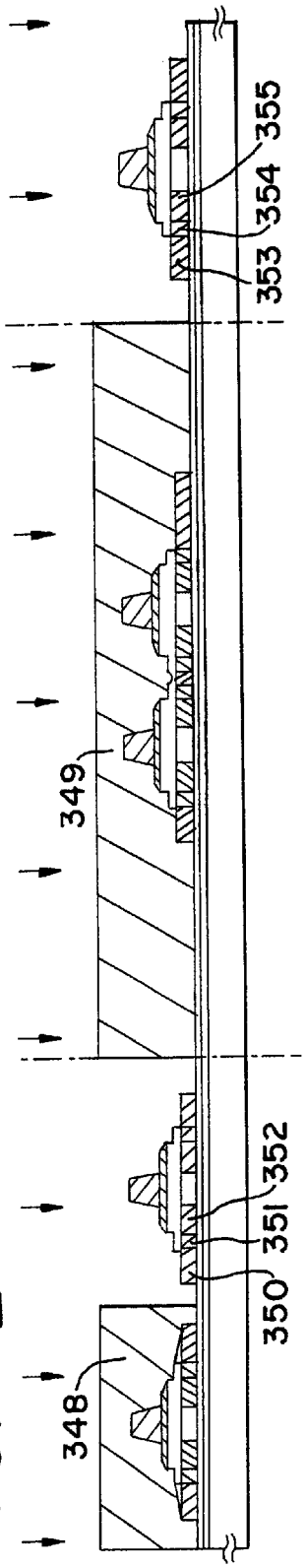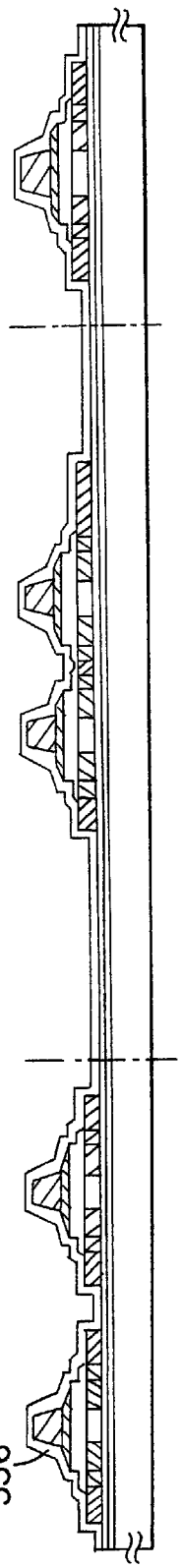

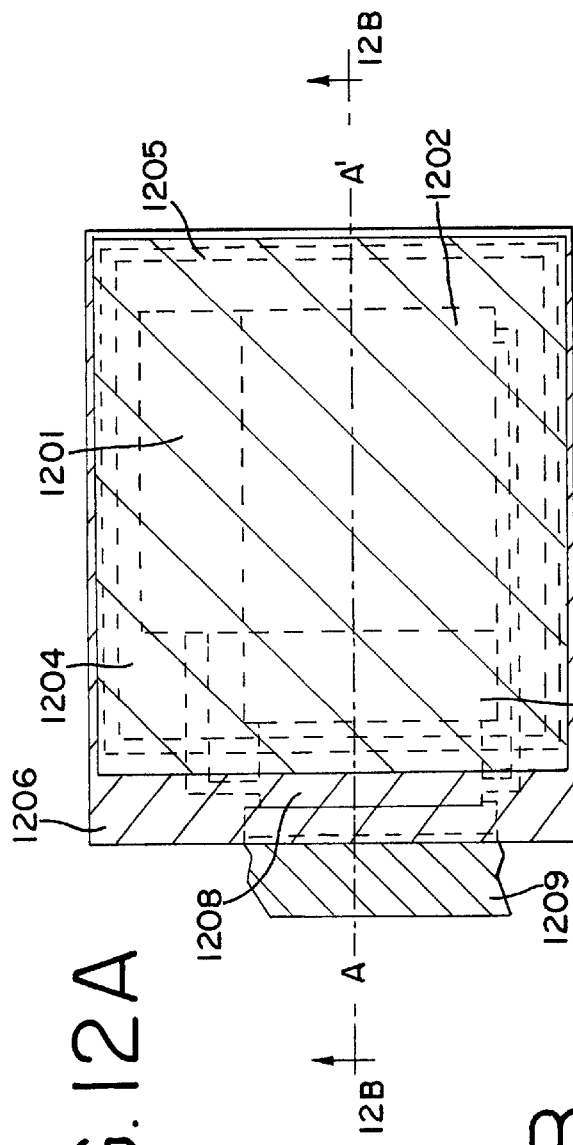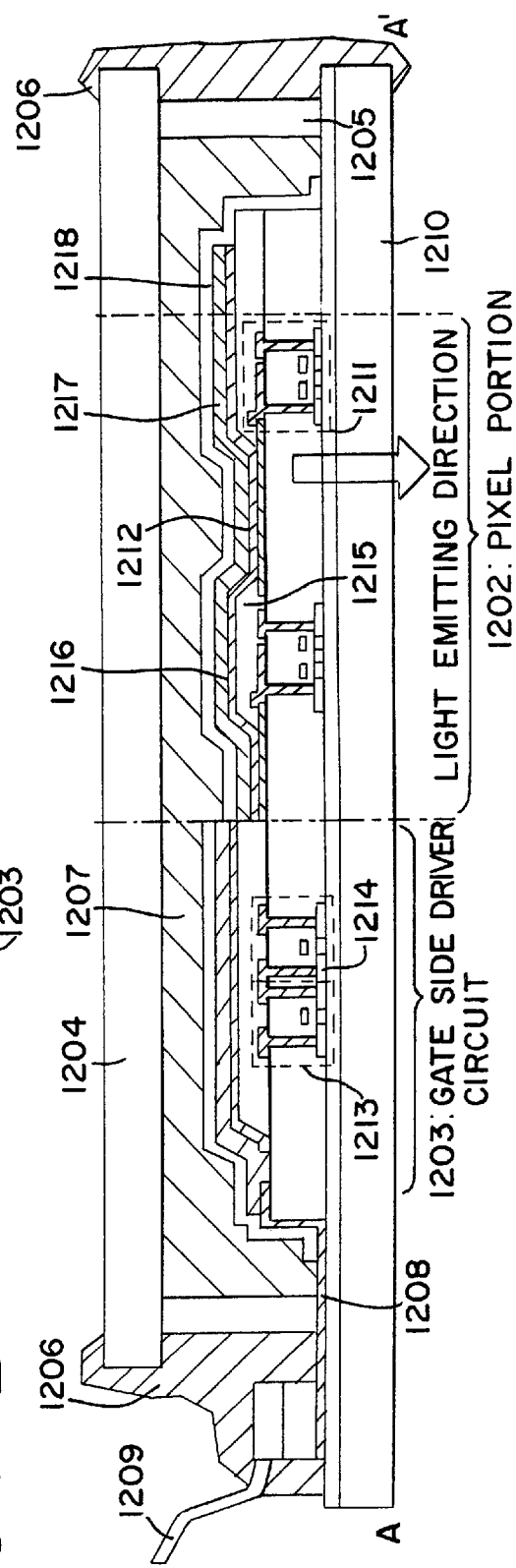
FIG.12A
FIG.12B

LIGHT EMITTING DEVICE

BACKGROUND OF THE INVENTION

1. Field of the Invention

The present invention relates to a light-emitting device which is constricted forming an EL (electro-luminescent) element on a substrate, the EL element being such that a light emissive material (herein below, termed "EL material") which can emit the light of fluorescence or phosphorescence by applying an electric field is sandwiched between a non-transparent electrode (cathode) and a transparent electrode (anode). Concretely, the invention relates to enhancement in the efficiency of deriving light from an EL element.

By the way, in the invention, the "light-emitting device" shall signify an image display device or a luminescent device which employs the EL element. Besides, the "light-emitting device" shall cover all of a module in which a connector, for example, an anisotropic conductive film (FPC: Flexible Printed Circuit), a TAB (Tape Automated Bonding) tape or a TCP (Tape Carrier Package) is attached to the EL element, a module in which a printed wiring board is disposed at the end of a TAB tape or a TCP, and a module in which an IC (integrated circuit) is directly mounted on the light emitting element in accordance with a COG (Chip On Glass) scheme.

2. Description of the Related Art

In recent years, techniques for forming TFTs (thin film transistors) on substrates have made great progress, and display devices (light-emitting devices) of active matrix type applying the TFTs have been being developed. Especially, a TFT employing a poly-silicon film exhibits a field effect mobility (also, simply termed "mobility") higher than that of a TFT employing a conventional amorphous silicon film and is capable of higher speed operation. Therefore, the control of pixels having been performed by driver circuits outside a substrate before can be performed by driver circuits formed on the same substrate as that of the pixels.

With such a light-emitting device of active matrix type, various advantages, for example, curtailment in a manufacturing cost, miniaturization in an electro-optic equipment, enhancement in an available percentage and increase in throughput, are attained by forming various circuits and elements on an identical substrate.

Further, researches have been vigorously made on light-emitting devices (EL displays) of active matrix type each having EL elements as spontaneous emission type elements.

Here in this specification, in the EL display being an example of the light-emitting device, the EL element has a structure in which an EL layer is sandwiched between a pair of electrodes (an anode and a cathode), and in which the EL layer has a multilayer structure ordinarily. Typically mentioned is the multilayer structure of "hole transporting layer/light emitting layer/electron transporting layer" proposed by Tang et al., Eastman Kodak Company. The multilayer structure exhibits a very high emission efficiency, and most of the EL display devices being currently under researches and developments adopt this structure.

Alternatively, the multilayer structure may be so formed that the anode is successively overlaid with a hole injecting layer/hole transporting layer/light emitting layer/electron transporting layer, or a hole injecting layer/hole transporting layer/light emitting layer/electron transporting layer/electron injecting layer. The light emitting layer may well be doped with a fluorescent coloring matter or the like.

In this specification, all layers interposed between the cathode and the anode shall be generally called the "EL layer". Accordingly, the hole injecting layer, hole transporting layer, light emitting layer, electron transporting layer and electron injecting layer mentioned above are all included in the "EL layer".

Herein, a predetermined voltage is applied to the EL layer of the above structure by the pair of electrodes, whereby light is emitted by the recombination of carriers taking place in the light emitting layer. By the way, in this specification, a light emitting element which is formed of the anode, EL layer and cathode shall be called the "EL element".

The EL layer included in the EL element is more deteriorated by heat, light, moisture, oxygen, etc. In general, therefore, the fabrication of the active matrix type EL display proceeds in such a way that EL elements are formed after wiring lines and TFTs have been formed in a pixel portion.

Besides, after the formation of the EL elements, a substrate provided with the EL elements (an EL panel) and a cover member are stuck together so as to prevent the EL elements from being exposed to the open air, and the resulting structure is sealed (packaged) by a sealing member or the like.

After air-tightness has been enhanced by the treatment of the packaging or the like, a connector (such as FPC or TAB tape) by which terminals led out of the elements or circuits formed on the substrate are connected with external signal terminals is attached, whereby the active matrix type EL display is finished up.

Recently, EL display devices each having EL elements have been developed. The EL element is a spontaneous emission type element of current drive type which utilizes light generation based on the recombination of electrons and holes injected into an EL layer from electrodes at both the surfaces of the EL element by applying a voltage, and from which emitted light is derived as planar one. However, a light deriving efficiency in the case where the light is emitted in the EL layer is derived as the planar emitted light out of the EL element is very low and is usually 20% or below.

Besides, the light emitted in the EL layer is wave-guided within the transparent electrode, depending upon the angle of incidence of the light. The light thus wave-guided is termed as the "wave-guided light". Part of the wave-guided light is absorbed to disappear, while the remainder is propagated within a solid thin film forming the transparent electrode, to escape to the end faces of the transparent electrode. In each pixel, therefore, the wave-guided light can be derived only partially as the planar emitted light, and light leakage to the adjacent pixel occurs in some cases.

SUMMARY OF THE INVENTION

It is accordingly an object of the invention to provide a structure in which light emitted in an EL layer is prevented from escaping from the end faces of a transparent electrode, thereby to enhance the efficiency of deriving the light and to solve the problem that an image blurs due to light leakage to an adjacent pixel.

The construction of the invention is shown in FIG. 1. By the way, a light-emitting device in the invention is such that a plurality of pixels are formed in the shape of a matrix within a pixel portion, and that each pixel includes a light emitting element 104 composed of a transparent electrode 101, an EL layer 102 and a non-transparent electrode 103 and is connected through wiring with a thin film transistor (TFT) (not shown) for driving the light emitting element 104. The "wiring" here signifies one which is made of a conductive material in order to establish electrical connection.

When carriers are respectively injected into the EL layer 102 from the transparent electrode 101 and the non-transparent electrode 103 formed on an insulating surface 100, they are recombined in the EL layer 102, thereby to emit light. Incidentally, the "transparent electrode 101" signifies an electrode which can transmit the light (visible light) emitted in the EL layer 102 and which is therefore disposed on a side where the light is emitted. In contrast, the "non-transparent electrode 103" signifies an electrode which cannot transmit the light and which is therefore disposed on a side where the light is not emitted.

Herein, a light shield portion 105 is interposed between the transparent electrodes 101 included in adjacent pixels, in order that the light emitted in the EL layer 102 in the pixel 1 may be prevented from leaking to the pixel 2 or pixel 3 which adjoins the pixel 1. Incidentally, the light shield portion 105 which is formed on this occasion may lie in touch with the peripheral part of the transparent electrode 101, but it need not always lie in touch.

Besides, the "light shield portion 105" in the invention signifies a portion which is formed on the insulating surface 100 overlaid with the transparent electrode 101, and which has the function of reflecting the light emitted in the EL layer 102 of the EL element 104 or intercepting it so as not to be wave-guided within the transparent electrode 101 and to leak from the peripheral part of the transparent electrode 101. Incidentally, the peripheral part of the transparent electrode 101 may lie either in touch with the light shield portion 105 or out of touch therewith.

The "light shield portion 105" in this specification is made of a light-shielding material which intercepts light. Such a material may be either a conductive material or an insulating material. Incidentally, the "conductive material" here signifies a material which has a certain degree of electrical conductivity, and a material whose electrical conductivity is sufficiently low and which is classified as an insulator is distinguished from the conductive material as the "insulating material".

By the way, in case of employing the conductive material for the light shield portion 105, a wiring line for connecting the transparent electrode 101 with a TFT can function as the light shield portion 105.

The conductive material which is employed for the light shield portion 105 should preferably be a material of high reflectivity. Incidentally, the "reflectivity" in this specification signifies a proportion which the energy of reflected light occupies relative to that of light (incident light) entering the surface of the particular material, in the visible light region of radiation. The "material of high reflectivity" signifies a material whose reflectivity is at least 60%, preferably at least 80%. Concretely, it signifies a material such as Ag, Al, Ta, Nb, Mo, Cu, Mg, Ni or Pb.

On the other hand, in a case where the light shield portion 105 is formed using the insulating material, it is possible to employ a material such as polyimide, polyamide, an acrylic resin or BCB (benzocyclobutene) in which a black pigment or carbon is dispersed. Besides, in this specification, the "EL element 104" signifies an element which has a structure including the non-transparent electrode 103 made of a non-transparent electrode material, the transparent electrode 101 made of a transparent electrode material, and the EL layer 102 sandwiched between the electrodes 103 and 101. The structure of the EL layer 102 may be formed only of a light emitting layer for offering the place of the recombination, or it may well include an electron injecting layer, an electron transporting layer, a hole transporting layer, an electron blocking layer, a hole blocking layer, or/and a hole injecting layer as may be needed. That is, in this specification, the "EL layer" includes all the layers into or within which the carriers from the electrodes are injected, transported and recombined.

Owing to the provision of the light shield portion 105, the light which progresses from the transparent electrode 101 toward the light shield portion 105 is intercepted to be reflected or absorbed. Thus, the direction of the light is controlled.

As described above, according to the invention, the light shield portion 105 is formed at the peripheral part of the transparent electrode 101 constituting the EL element 104, whereby the light emitted in the EL layer 102 can be prevented from being lost or leaking to the adjacent pixels on account of escaping from the peripheral part of the transparent electrode 101, and the efficiency of deriving the light can be sharply heightened.

Further, it should be noted that the light-emitting devices referred to in this specification include triplet-based light emission devices and/or singlet-based light emission devices, for example.

BRIEF DESCRIPTION OF THE DRAWINGS

FIGS. 3A through 3C are sectional views showing the fabricating steps of a light-emitting device;

FIGS. 4A through 4C are sectional views showing the fabricating steps of the light-emitting device;

FIGS. 12A and 12B are views showing the external appearances of a light-emitting device in a yet further embodiment;

PREFERRED EMBODIMENTS OF THE INVENTION

An aspect of performance of the invention will be described with reference to FIG. 1. Incidentally, FIG. 1 is premised on a case where a light-emitting device has a structure as shown in FIG. 2, but it is schematically depicted in order to facilitate the description.

Figure 1:
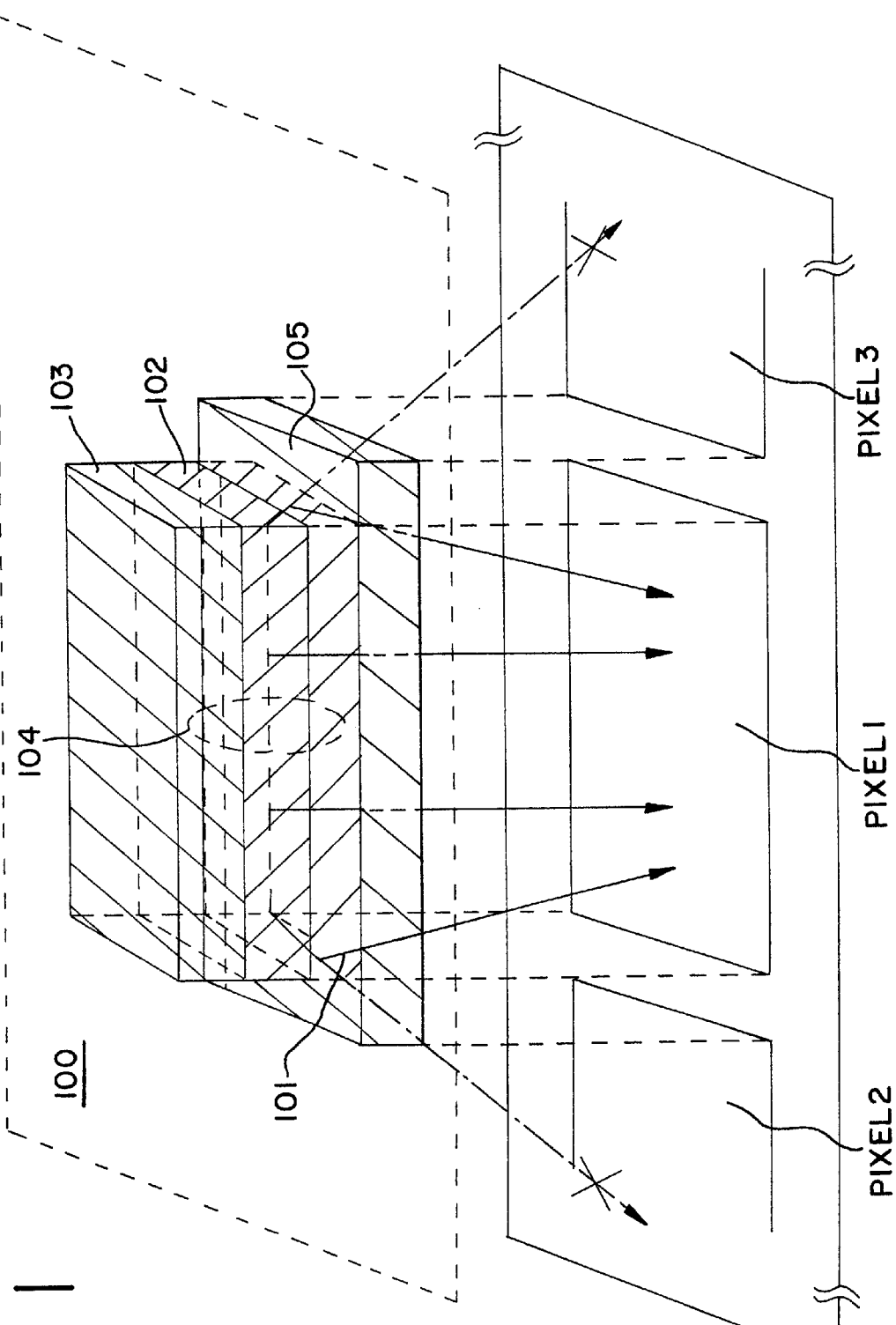
FIG. 1 is a schematic view showing the construction of a light shield portion in the invention.
Figure 2A:
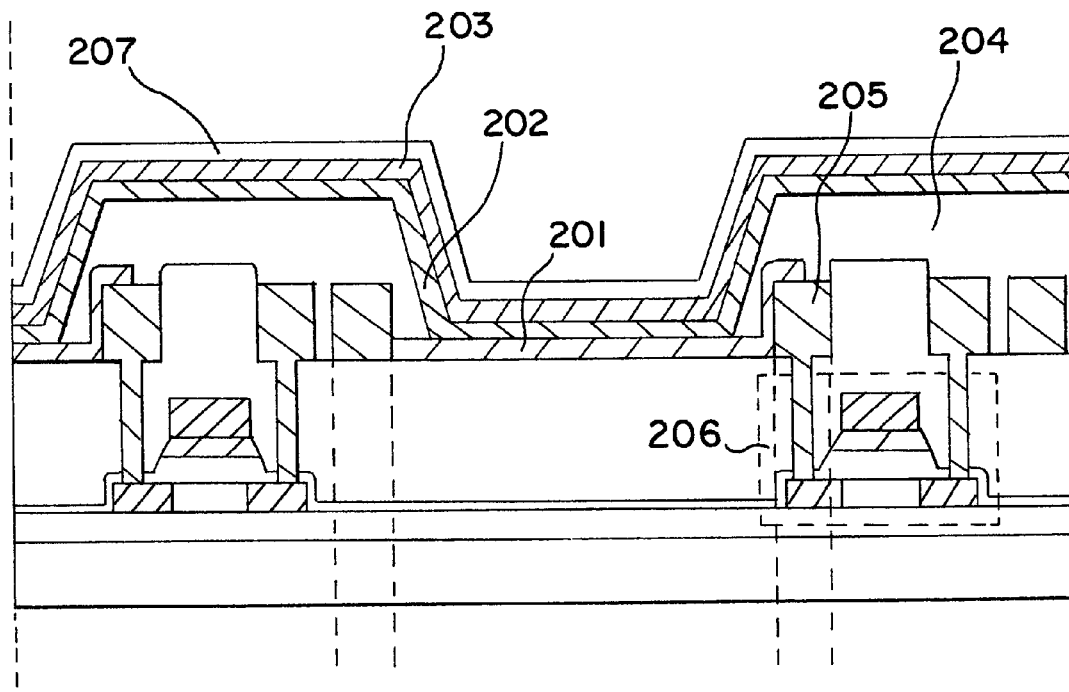
FIG. 2 is a view showing a sectional structure in the vicinity of the pixel of the light-emitting device.
Figure 2B:
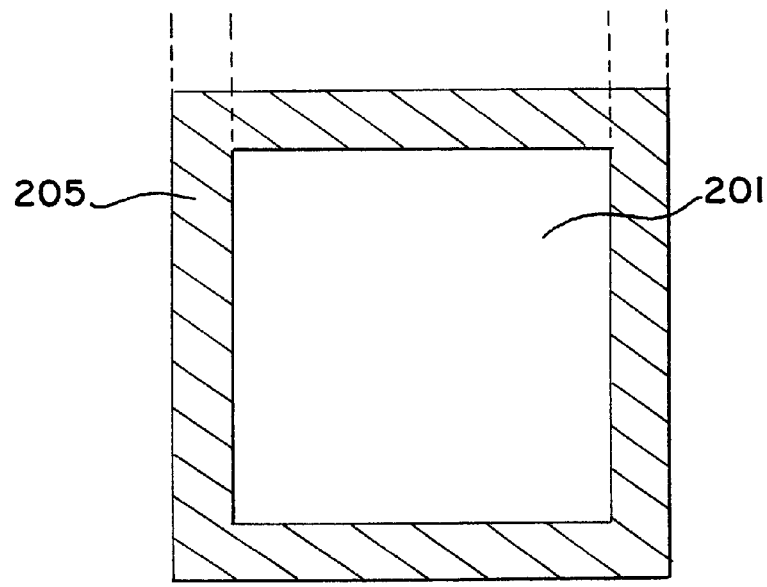

Referring to FIG. 1, numeral 101 designates a transparent electrode which is made of a transparent metal material and which functions as an anode. The transparent electrode 101 may be formed of an indium tin oxide (ITO) film, or a transparent conductive film in which 2%–20% of zinc oxide (ZnO) is mixed in indium oxide. Further, it can be appropriately formed of an oxide conductive film which is made of, for example, zinc oxide doped with gallium (Ga) (denoted by ZnO:Ga) in order to heighten a transmission factor for visible light and a conductivity.

Besides, numeral 102 designates an EL layer, and numeral 103 designates an non-transparent electrode which functions as a cathode. An element which is composed of the non-transparent electrode 103, EL layer 102 and transparent electrode 101, is called an "EL element" 104 in this specification.

In the EL layer 102 of the EL element 104, light is emitted by the recombination between electrons injected from the cathode 103 and holes injected from the anode 101. By the way, in this aspect of performance, the light emitted in the EL layer 102 is transmitted through the transparent electrode 101 so as to illuminate a pixel.

However, when part of the light is wave-guided within the transparent electrode 101 during the transmission through this transparent electrode, that is, when wave-guided light is emitted, light is confined within the transparent electrode 101, or/and light leaks from the peripheral part of the transparent electrode 101.

Thus, the brightness of a pixel portion lowers due to the loss of the light. Moreover, when the partial light enters an adjacent pixel due to the light leakage, the contrast of the pixel lowers to blur this pixel.

Therefore, a light shield portion 105 which has the function of intercepting light is disposed at the peripheral part of the transparent electrode 101, thereby to prevent the light loss and the light leakage.

The light shield portion 105 may be formed of either a material which reflects the light leaking from the peripheral part of the transparent electrode 101 or a material which merely intercepts the light so as not to leak out.

The material which is employed for the light shield portion 105, should preferably be a material of high reflectivity. Incidentally, the "material of high reflectivity" in this specification signifies a material whose reflectivity is preferably at least 60%, more preferably at least 80%, within the visible light region of radiation. Concretely, it signifies a material such as Ag, Al, Ta, Nb, Mo, Cu, Mg, Ni or Pb.

Besides, the light shield portion 105 may well have different shapes, depending upon structures each of which constructs the EL element 104. This will be detailed later in conjunction with embodiments.

As seen from FIG. 1, the light shield portion 105 is disposed so as to form an identical layer with the transparent electrode 101. Thus, even when the light for illuminating a pixel 1 as shown in FIG. 1 by way of example is about to enter a pixel 2 or a pixel 3 from the peripheral part of the transparent electrode 101, it can be reflected and intercepted.

Next, FIG. 2 shows a sectional structure in the vicinity of a pixel provided with a light shield portion. First, a thin film transistor (TFT) is formed on an insulating surface. Shown in FIG. 2 is a current controlling TFT 206 which is electrically connected with a transparent electrode 201 formed within the pixel.

Here, the light shield portion 205 made of a drain wiring line is formed after the formation of the current controlling TFT 206. The formation of the light shield portion 205 is followed by the formation of the transparent electrode 201. Thus, a structure in which the peripheral part of the transparent electrode 201 is covered with the light shield portion 205 can be formed.

In the foregoing, the light shield portion 205 has been explained as being formed on the same plane as the insulating surface on which the transparent electrode 201 is formed. In this specification, such a structural relation includes also a case where the transparent electrode 201 extends covering part of the light shield portion 205 as shown in FIG. 2.

An interlayer insulating film 204 is subsequently formed so as to overlie parts of the transparent electrode 201 and the light shield portion 205, an EL layer 202 and an non-transparent electrode 203 are further formed on the transparent electrode 201, and a passivation film 207 is finally provided. In this way, an EL module is completed. Besides, the EL module is furnished with a sealing member into a structure capable of electrical connection with an external power supply. Then, the light-emitting device according to the invention can be finished up.

[Embodiment 1]

Here, a method of simultaneously forming, on the same substrate, a pixel portion and TFTs (n-channel TFT and p-channel TFT) of a driver circuit provided in the periphery of the pixel portion, is described in detail with FIGS. 3 to 5.

This embodiment illustrates the EL module of its state of completion, the method of forming the EL module to complete as a light-emitting device will be shown subsequent embodiments.

First, in this embodiment, a substrate 300 is used, which is made of glass such as barium borosilicate glass or aluminum borosilicate, represented by such as Corning #7059 glass and #1737 glass. Note that, as the substrate 300, there is no limitation provided that it is a substrate with transmittance, and a quartz substrate may be used. A plastic substrate with heat resistance to a process temperature of this embodiment may also be used.

Then, a base film 301 formed of an insulating film such as a silicon oxide film, a silicon nitride film or a silicon oxynitride film is formed on the substrate 300. In this embodiment, a two-layer structure is used as the base film 301. However, a single-layer film or a lamination structure consisting of two or more layers of the insulating film may be used. As a first layer of the base film 301, a silicon oxynitride film 301a is formed with a thickness of 10 to 200 nm (preferably 50 to 100 nm) with a plasma CVD method using $SiH_4$, $NH_3$, and $N_2O$ as reaction gas. In this embodiment, the silicon oxynitride film 301a (composition ratio Si=32%, O=27%, N=24% and H=17%) with a film thickness of 50 nm is formed. Then, as a second layer of the base film 301, a silicon oxynitride film 301b is formed and laminated into a thickness of 50 to 200 nm (preferably 100 to 150 nm) with a plasma CVD method using $SiH_4$ and $N_2O$ as reaction gas. In this embodiment, the silicon oxynitride film 301b (composition ratio Si=32%, O=59%, N=7% and H=2%) with a film thickness of 100 nm is formed.

Subsequently, semiconductor layers 302 to 305 are formed on the base film. The semiconductor layers 302 to 305 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 302 to 305 are formed into the thickness of from 25 to 80 nm (preferably 30 to 60 nm). The material of the crystalline semiconductor film is not particularly limited, but it is preferable to be formed of silicon, a silicon germanium ($Si_xGe_{1-x}$ (X=0.0001 to 0.02)) alloy, or the like. In this embodiment, 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 302 to 305.

Further, after the formation of the semiconductor layers 302 to 305, a minute amount of impurity element (boron or phosphorus) may be doped to control a threshold value of the Besides, in the case where the crystalline semiconductor film is manufactured by the laser crystallization method, a pulse-oscillation type or continuous-wave type excimer laser, YAG laser, or $YVO_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 300 Hz, and a laser energy density is set as 100 to 400 $mJ/cm^2$ (typically 200 to 300 $mJ/cm^2$). In the case where the YAG laser is used, it is appropriate that the second harmonic is used to with a pulse oscillation frequency of 30 to 300 Hz and a laser energy density of 300 to 600 $mJ/cm^2$ (typically, 350 to 500 $mJ/cm^2$). Then, laser light condensed into a linear shape with a width of 100 to 1000 $\mu$m, for example, 400 $\mu$m is irradiated to the whole surface of the substrate, and an overlapping ratio (overlap ratio) of the linear laser light at this time may be set as 50 to 90%.

A gate insulating film 306 is then formed for covering the semiconductor layers 302 to 305. The gate insulating film 306 is formed of an insulating film containing silicon by a plasma CVD method or a sputtering method into a film thickness of from 40 to 150 nm. In this embodiment, the gate insulating film 306 is formed of a silicon oxynitride film into a thickness of 110 nm by a plasma CVD method (composition ratio Si=32%, O=59%, N=7%, and H=2%). Of course, the gate insulating film is not limited to the silicon oxynitride film, and other insulating films containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHz) power density of 0.5 to 0.8 $W/cm^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 3A, on the gate insulating film 306, a first conductive film 307 with a thickness of 20 to 100 nm and a second conductive film 308 with a thickness of 100 to 400 nm are formed and laminated. In this embodiment, the first conductive film 307 of TaN film with a film thickness of 30 nm and the second conductive film 308 of W film with a film thickness of 370 nm are formed into lamination. The TaN film is formed by sputtering with a Ta target under a nitrogen-containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 $\mu\Omega$cm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a target with a purity of 99.9999%, and in addition, by taking sufficient consideration to prevent impurities within the gas phase from mixing therein during the film formation, a resistivity of from 9 to 20 $\mu\Omega$cm can be realized.

Note that, in this embodiment, the first conductive film 307 is made of TaN, and the second conductive film 308 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an Ag, Pd, Cu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next masks 309 to 312 made of resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is emitted by applying a 500 W RF (13.56 MHz) power to a coil shape electrode under 1 Pa. A dry etching device with ICP (Model E645-□ICP) produced by Matsushita Electric Industrial Co. Ltd. is used here. A 150 W RF (13.56 MHz) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, the first etching conditions are changed into the second etching conditions without removing the masks 309 to 312 made of resist, a mixed gas of $CF_4$ and $Cl_2$ is used as an etching gas, the gas flow rate is set to 30/30 sccm, and plasma is emitted by applying a 500 W RF (13.56 MHz) power to a coil shape electrode under 1 Pa to thereby perform etching for about 30 seconds as shown in FIG. 3B. A 20 W RF (13.56 MHz) power is also applied to the substrate side (test piece stage) to effectively a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 314 to 317 (first conductive layers 314a to 317a and second conductive layers 314b to 317b) constituted of the first conductive layers and the second conductive layers are formed by the first etching process. Reference numeral 319 denotes a gate insulating film, and regions of the gate insulating film which are not covered by the first shape conductive layers 314 to 317 are made thinner by approximately 20 to 50 nm by etching.

Then, a first doping process is performed to add an impurity element for imparting an n-type conductivity to the semiconductor layer without removing the mask made of resist (FIG. 3B). Doping may be carried out by an ion doping method or an ion injecting method. The condition of the ion doping method is that a dosage is $1\times10^{13}$ to $5\times10^{15}$ atoms/$cm^2$, and an acceleration voltage is 60 to 100 keV. In this embodiment, the dosage is $1.5\times10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 314 to 317 become masks to the impurity element for imparting the n-type conductivity, and high concentration impurity regions 320 to 323 are formed in a self-aligning manner. The impurity element for imparting the n-type conductivity is added to the high concentration impurity regions 320 to 323 in the concentration range of $1\times10^{20}$ to $1\times10^{21}$ atoms/$cm^3$.

Thereafter, the second etching process is performed without removing the masks made of resist as shown in FIG. 3C. Here, a mixed gas of $CF_4$, $Cl_2$ and $O_2$ is used as an etching gas, the gas flow rate is set to 25/25/10 sccm, and plasma is emitted by applying a 500 W RF (13.56 MHz) power to a coil shape electrode under 1 Pa to thereby perform etching. A 20 W RF (13.56 MHz) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 324b to 327b are formed by the second etching process. On the other hand, the first conductive layers 314a to 318a are hardly etched, and first conductive layers 324a to 328a are formed.

Next, a second doping process is performed. Second conductive layers 324b to 328b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $3.5\times10^{12}$ atoms/$cm^2$ and the acceleration voltage of 90 keV. Thus, low concentration impurity regions 329 to 332, which overlap with the first conductive layers, are formed in a self-aligning manner. The concentration of phosphorus (P) in the low concentration impurity regions 329 to 332 is $1\times10^{17}$ to $1\times10^{18}$ atoms/$cm^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the impurity element is added to the high concentration impurity regions 333 to 336 to form, high concentration impurity regions 333 to 336.

Thereafter, a third etching process is performed without removing the masks made of resist as shown in FIG. 4A. The tapered portions of the first conductive layers are partially etched to thereby reduce the regions that overlap with the semiconductor layer in the third etching process. Here, $CHF_3$ is used as an etching gas, and a reactive ion etching method (RIE method) is used. In this embodiment, the third etching process is performed with the chamber pressure of 6.7 Pa, the RF power of 800 W, the $CHF_3$ gas flow rate of 35 sccm. Thus, first conductive layers 337 to 340 are formed by a third etching process.

In the third etching process, the insulating film 319 is etched at the same time, a part of the high concentration impurity regions 333 to 336 is exposed, and insulating films 346a to 346d and 347 are formed. Note that, in this embodiment, the etching condition by which the part of the high concentration impurity regions 333 to 336 is exposed is used, but it is possible that a thin layer of the insulating film is left on the high concentration impurity regions if the thickness of the insulating film or the etching condition is changed.

In accordance with the third etching process, impurity regions (LDD regions) 337a to 340a are formed, which do not overlap with the first conductive layers 341 to 344. Note that, impurity regions (GOLD regions) 337b to 340b remain overlapped with the first conductive layers 341 to 344.

The electrode formed of the first conductive layer 341 and the second conductive layer 324b becomes a gate electrode of an n-channel TFT of a driver circuit to be formed in the later process. The electrode formed of the first conductive layer 342 and the second conductive layer 325b becomes a gate electrode of a p-channel TFT of the driver circuit to be formed in the later process. Similarly, the electrode formed of the first conductive layer 343 and the second conductive layer 326b becomes a gate electrode of an n-channel TFT of a pixel portion to be formed in the later process, and the electrode formed of the first conductive layer 344 and the second conductive layer 327b becomes a gate electrode of an n-channel TFT of a pixel portion to be formed in the later process. Further, the electrode formed of the first conductive layer 345 and the second conductive layer 328b becomes one of electrodes of a storage capacitor of the pixel portion to be formed in the later process.

In accordance with the above processes, in this embodiment, the difference between the impurity concentration in the impurity regions (GOLD regions) 337b to 340b that overlap with the first conductive layers 341 to 344 and the impurity concentration in the impurity regions (LDD regions) 337a to 340a that do not overlap with the first conductive layers 341 to 344 can be made small, thereby improving the TFT characteristics.

Next, the masks of resist are removed, masks 348 and 349 are newly formed of resist, and a third doping process is performed. In accordance with the third doping process, impurity regions 350 to 355 are formed, in which the impurity element imparting a conductivity (p-type) opposite to the above conductivity (n-type) is added to the semiconductor layer that becomes an active layer of the p-channel TFT (FIG. 4B). The first conductive layers 342 and 344 are used as masks to the impurity element, and the impurity element that imparts the p-type conductivity is added to thereby form impurity regions in a self-aligning manner. In this embodiment, the impurity regions 350 to 355 are formed by an ion doping method using diborane ($B_2H_6$). Note that, in the third doping process, the semiconductor layer to become the n-channel TFT is covered with the masks 348 and 349 formed of resist. Although phosphorus is added to the impurity regions of the semiconductor layer to become the p-channel TFT at different concentrations in accordance with the first and second doping processes, the doping process is performed such that the concentration of the impurity element imparting p-type conductivity is in the range of $2 \times 10^{20}$ to $2 \times 10^{21}$ atoms/cm$^3$ in any of the impurity regions. Thus, the impurity regions function as a source region and a drain region of the p-channel TFT with no problem. In this embodiment, a part of the semiconductor that becomes an active layer of the p-channel TFT is exposed, and thus, there is an advantage that an impurity element (boron) is easily added. In accordance with the above-described processes, the impurity regions are formed in the respective semiconductor layers.

Subsequently, the masks 348 and 349 of resist are removed, and an insulating film to be a first interlayer insulating film 356 is formed. This insulating film is formed of an insulating film containing silicon by a plasma CVD method or a sputtering method into a thickness of 100 to 200 nm. In this embodiment, a silicon oxynitride film with a film thickness of 150 nm is formed by a plasma CVD method. Of course, the insulating film formed here is not particularly limited to the silicon oxynitride film, but an other insulating film containing silicon may be formed into a single layer or a lamination structure.

Then, as shown in FIG. 4C, a step of activating the impurity elements added in the respective semiconductor layers is performed. This step is carried out by thermal annealing using a furnace annealing oven. The thermal annealing may be performed in a nitrogen atmosphere containing an oxygen content of 1 ppm or less, preferably 0.1 ppm or less, at 400 to 700° C., typically 500 to 550° C. In this embodiment, a heat treatment at 550° C. for 4 hours is carried out. Note that, except the thermal annealing method, a laser annealing method, or a rapid thermal annealing method (RTA method) can be applied thereto.

Note that, in this embodiment, at the same time as the above activation process, nickel used as the catalyst in crystallization is gettered to the impurity regions (333, 335, 350 and 353) containing phosphorus at a high concentration. As a result, nickel concentration of the semiconductor layer which becomes a channel forming region is mainly lowered. The TFT with a channel forming region thus formed has an off current value decreased, and has high electric field mobility because of good crystallinity, thereby attaining satisfactory characteristics.

Further, an activation process may be performed before forming the above mentioned insulating film. However, in the case where a wiring material used is weak to heat, it is preferable that the activation process is performed after an interlayer insulating film (an insulating film containing silicon as its main ingredient, for example, silicon nitride film) is formed to protect the wiring or the like as in this embodiment.

In addition, heat treatment at 300 to 550° C. for 1 to 12 hours is performed in an atmosphere containing hydrogen of 3 to 100%, to perform a step of hydrogenating the semiconductor layers. In this embodiment, the heat treatment is performed at 410° C. for 1 hour in an atmosphere containing hydrogen in the interlayer insulating film. As another means for hydrogenation, plasma (using hydrogen excited by plasma) may be carried out.

Besides, in the case of using a laser annealing method as the activation process, it is preferred to irradiate laser light such as an excimer laser or YAG laser after the hydrogenating process.

Figure 5A:
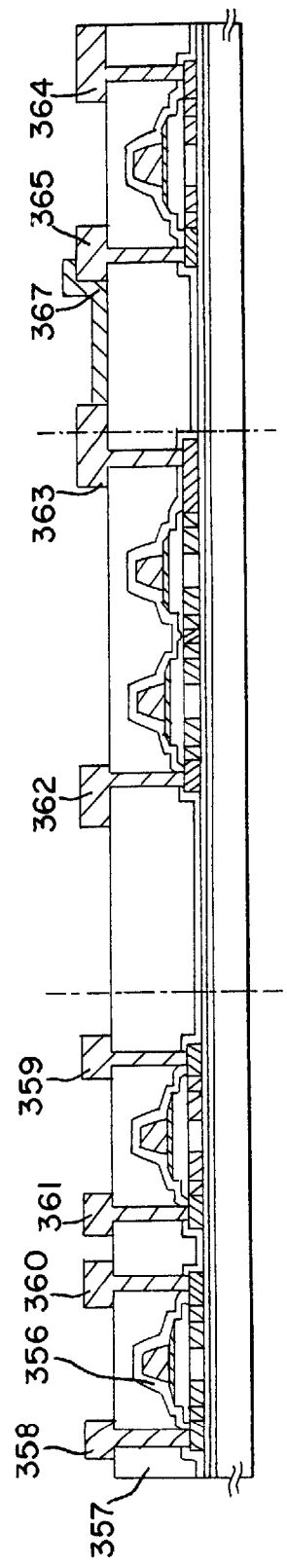
FIGS. 5A and 5B are sectional views showing the fabricating steps of the light-emitting device.

By the way, in this embodiment, as shown in FIG. 5A, a first interlayer insulating film 357 having a multilayer structure is formed in such a way that an insulating film made of an organic insulating material is formed on the insulating film of the silicon oxynitride film formed before. In an example of this embodiment, an acrylic resin film being 1.6 μm thick was formed. Subsequently, patterning is performed for forming contact holes which reach the respective impurity regions 333, 335, 350, 353.

Incidentally, the organic insulating material to be employed here may be an organic resin, which can be selected from among materials such as polyimide, polyamide, an acrylic resin and BCB (benzocyclobutene). Especially, the acrylic resin of excellent flatness is preferable because the organic insulating material is highly intended to flatten a structure. The thickness of the acrylic resin film should preferably set at 1 μm–5 μm (more preferably, at 2 μm–4 μm).

Besides, dry etching or wet etching can be employed for the formation of the contact holes.

Further, wiring lines 358–365 which are electrically connected with the respective impurity regions 333, 335, 350, 353 are formed. Incidentally, the wiring line 365 formed here functions as a light shield portion in the invention. Also, a multilayer film which consists of a Ti film being 50 nm thick and an alloy film (made of an alloy of Al and Ti) being 500 nm thick is formed by patterning, but a different conductive film may well be employed.

Concretely, a material of high reflectivity, such as Al, Ta, Nb, Mo or Ag is preferable as a material which is employed for the light shield portion. Incidentally, the "material of high reflectivity" in this specification signifies a material whose reflectivity within the visible light region of radiation is preferably at least 60%, more preferably at least 80%.

Besides, in case of employing a material which has the function of intercepting light, a material of low transmission factor should desirably be selected.

Subsequently, a transparent conductive film is formed on the resulting structure to a thickness of 80 nm–120 nm and is patterned, thereby to form a transparent electrode 367 (FIG. 5A). By the way, in an example of this embodiment, the transparent electrode 367 was formed of an indium tin oxide (ITO) film, or the transparent conductive film in which 2–20% of zinc oxide (ZnO) was mixed in indium oxide. In this way, the transparent electrode 367 and the light shield portion 365 can be formed at an identical layer.

Besides, the transparent electrode 367 is formed overlapping the drain wiring line 365 in touch therewith, thereby to be electrically connected with the drain region of a current controlling TFT.

Figure 5B:
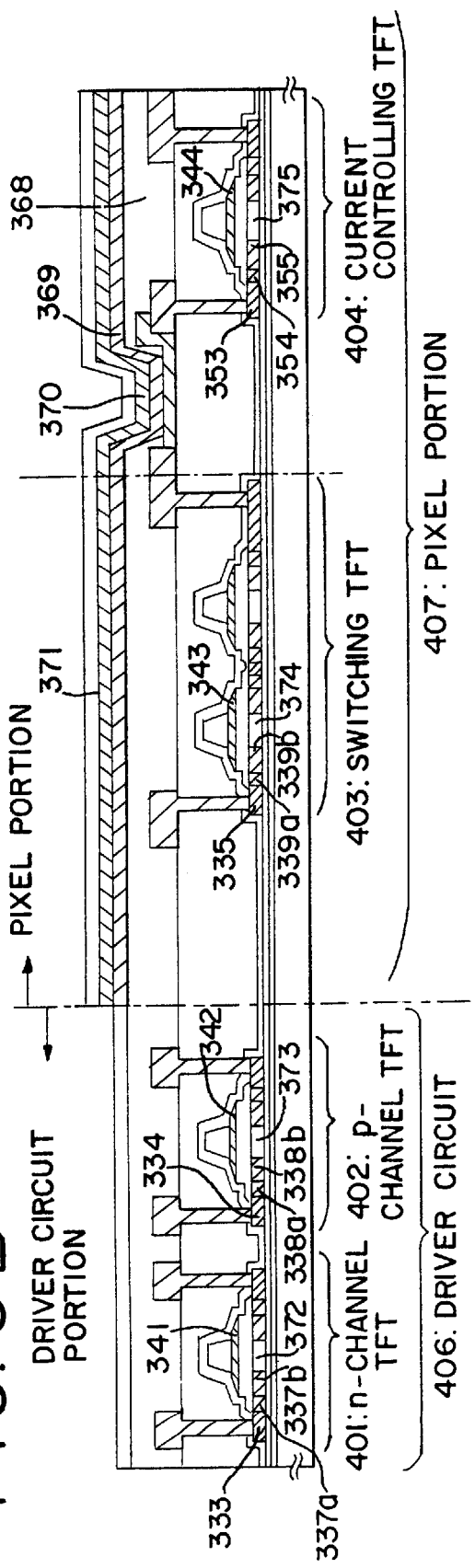

Subsequently, as shown in FIG. 5B, an insulating film containing silicon (a silicon oxide film in this embodiment) is formed to a thickness of 500 nm, and it is formed with an opening at a position corresponding to the tansparent electrode 367, thereby to form a second interlayer insulating film 368 which functions as a bank. When wet etching is employed in forming the opening, a tapered sidewall can be formed with ease. Care needs to be taken of the fact that, unless the sidewall of the opening is sufficiently gentle, the deterioration of an EL layer attributed to a stepped structure is posed as a conspicuous problem.

Subsequently, the EL layer 369 and a cathode (MgAg electrode) 370 are continuously formed without exposing the resulting structure to the atmospheric air by employing vacuum evaporation. Incidentally, the thickness of the EL layer 369 may be set at 80 nm–200 nm (typically, 100 nm–120 nm), and that of the cathode 370 at 180 nm–300 nm (typically, 200 nm–250 nm).

At this step, the EL layers and the cathodes are successively formed for pixels corresponding to the color of red, pixels corresponding to the color of green, and pixels corresponding to the color of blue. Since, however, the EL layers are less immune against solutions, they must be formed for the individual colors without employing photolithography. It is therefore preferable that the EL layers and the cathodes are formed at selected necessary parts by concealing the other area than the desired pixels with a metal mask.

More specifically, the mask which conceals all the other part than the pixels corresponding to the color of red is first set, and the EL layers which emitted red light are selectively formed using the mask. Subsequently, the mask which conceals all the other area than the pixels corresponding to the color of green is set, and the EL layers which emitted green light are selectively formed using the mask. Subsequently, the mask which conceals all the other area than the pixels corresponding to the color of blue is similarly set, and the EL layers which emitted blue light are selectively formed using the mask. Incidentally, although the respectively different masks are employed here, an identical mask may well be properly used.

The scheme in which three sorts of EL elements corresponding to the colors R, G and B are formed, is employed here. It is also allowed, however, to employ any of a scheme in which EL elements emitting white light are combined with color filters, a scheme in which EL elements emitting blue or bluish green light are combined with a fluorescent substance (fluorescent color conversion medium: CCM), a scheme in which EL elements corresponding to the colors of R, G and B are stacked by utilizing a transparent electrode as a cathode (counter-electrode), and so forth.

Incidentally, a known material can be employed for the EL layer 369. By way of example, a quadruple-layer structure which consists of a hole injecting layer, a hole transporting layer, a light emitting layer and an electron injecting layer may be used as the EL layer.

Further, an EL layer may well be formed of a known high-polymer EL material by spin coating.

Subsequently, using a metal mask, the cathodes 370 are formed for the pixels (pixels of identical line) having switching TFTs whose gate electrodes are connected to the identical gate signal line. Incidentally, although the cathodes 370 are made of MgAg in this embodiment, the invention is not restricted to the material. Another known material such as LiF/Al may well be employed for the cathodes 370.

Lastly, a passivation film 371 made of a silicon nitride film is formed to a thickness of 300 nm. Owing to the formation of the passivation film 371, the EL layers 369 can be protected from moisture etc., and the reliability of the EL elements can be more enhanced.

Thus, an EL module having a structure as shown in FIG. 5B is completed. By the way, in the fabricating process of the EL module in this embodiment, in relation to the arrangement of circuits and the steps of the process, source signal lines are formed of Ta and W which are materials forming the gate electrodes, and the gate signal lines are formed of Al which is a wiring material forming source and drain electrodes. It is also allowed, however, to employ different materials.

Besides, a driver circuit 406 which includes an n-channel TFT 401 as well as a p-channel TFT 402, and a pixel portion 407 which includes the switching TFT 403 as well as the current controlling TFT 404 can be formed on the same substrate.

The n-channel TFT 401 of the driver circuit 406 includes a channel forming region 372, the lightly-doped impurity region 337b (GOLD region) overlapped by the first conductive layer 341 forming part of the gate electrode of the TFT, the lightly-doped impurity region 337a (LDD region) formed outside the gate electrode, and the heavily-doped impurity region 333 functioning as the source region or drain region of the TFT. The p-channel TFT 402 includes a channel forming region 373, the impurity region 338b overlapped by the first conductive layer 342 forming part of the gate electrode of the TFT, the impurity region 338a formed outside the gate electrode, and the impurity region 334 functioning as the source region or drain region of the TFT.

The switching TFT 403 of the pixel portion 407 includes a channel forming region 374, the lightly-doped impurity region 339b (GOLD region) overlapped by the first conductive layer 343 forming the gate electrode of the TFT, the lightly-doped impurity region 339a (LDD region) formed outside the gate electrode, and the heavily-doped impurity region 335 functioning as the source region or drain region of the TFT. The current controlling TFT 404 includes a channel forming region 375, the lightly-doped impurity region 355 (GOLD region) overlapped by the first conductive layer 344 forming the gate electrode of the TFT, the lightly-doped impurity region 354 (LDD region) formed outside the gate electrode, and the heavily-doped impurity region 353 functioning as the source region or drain region of the TFT. Besides, in this embodiment, storage capacitors may well be formed in such a way that separately from the formation of the TFTs, a crystalline semiconductor film doped with an impurity is formed so as to form the first electrodes of the capacitors, and that at the step of forming the gate electrodes, a conductive film is formed on the first electrodes through an insulating film so as to form the second electrodes of the capacitors.

[Embodiment 2]

Figure 6:
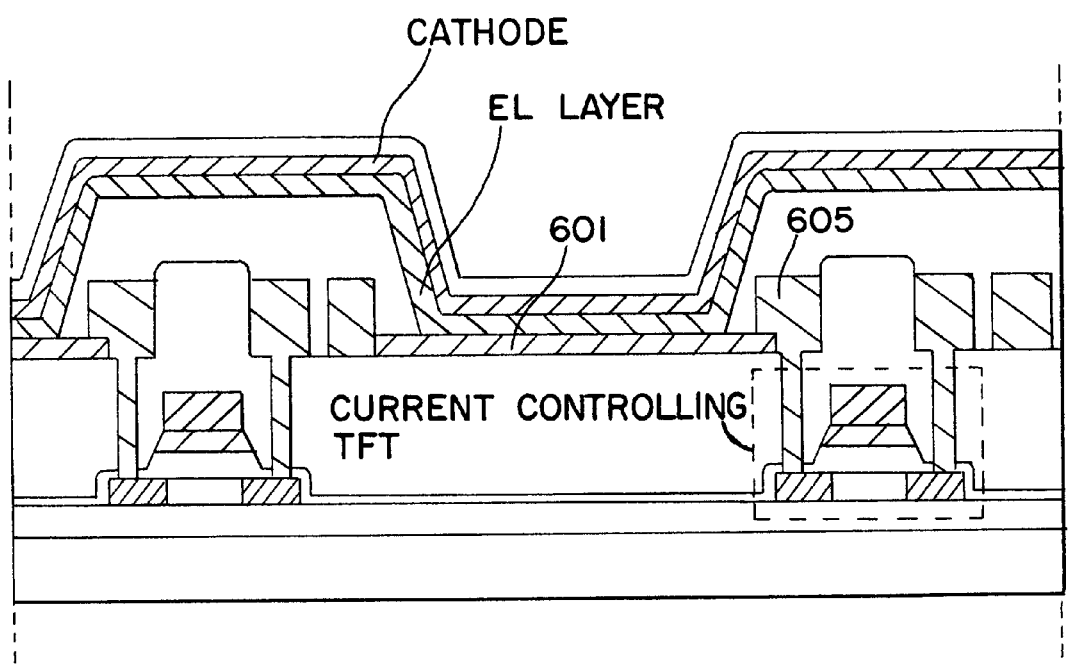
FIG. 6 is a view showing a sectional structure in the vicinity of the pixel of a light-emitting device in another embodiment.

Embodiment 1 has been described on the method wherein the invention is performed by the process in which the transparent electrode is formed after the formation of the light shield portion. As shown in FIG. 6, however, a light shield portion 605 functioning also as a drain wiring line may well be provided after the formation of a transparent electrode 601.

In a case where, as in this embodiment, the light shield portion (drain wiring line) 605 is formed so as to overlap the transparent electrode 601 thinner than the portion 605, the electrical connection part between the light shield portion (drain wiring line) 605 and the transparent electrode 601 is formed with ease.

Incidentally, the construction of this embodiment can be employed in optional combination with the construction of Embodiment 1.

[Embodiment 3]

Next, the shapes of light shield portions each of which is formed so as to cover the peripheral part of a transparent electrode are shown regarding the plan structures and sectional structures thereof in FIGS. 7A through 7E. Incidentally, this embodiment will be described on a case where a transparent electrode is an anode, while a non-transparent electrode is a cathode.

Figure 7A:
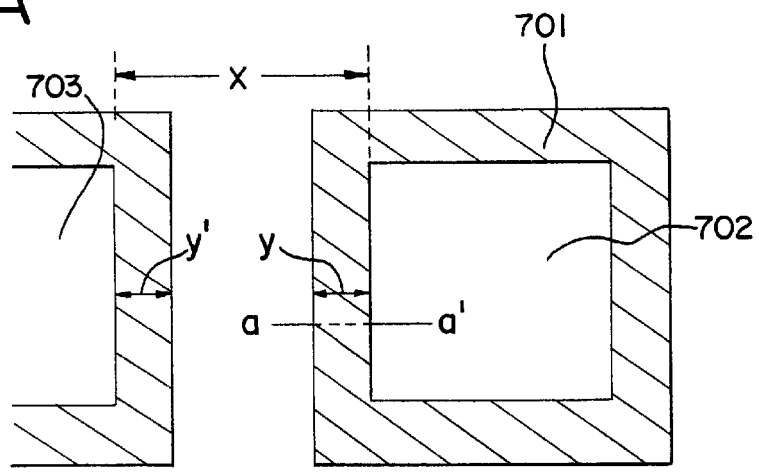
FIGS. 7A through 7E are views showing the details of light shield portions.

FIG. 7A is a top plan view, in which a light shield portion 701 is shaped so as to cover the whole peripheral part of an anode 702. Owing to such a shape, light to leak from the peripheral part of the anode 702 can be entirely reflected or intercepted. Incidentally, the widths of light shield portions on this occasion should preferably assume at least 2/3 relative to an interval x between adjacent anodes 702 and 703. More specifically, an anode 703 shown in FIG. 7A corresponds to a pixel adjoining the pixel of the anode 702. The expression "widths of light shield portions" here signifies the total widths (y+y') of the light shield portions of the anodes 702 and 703.

Figure 7B:
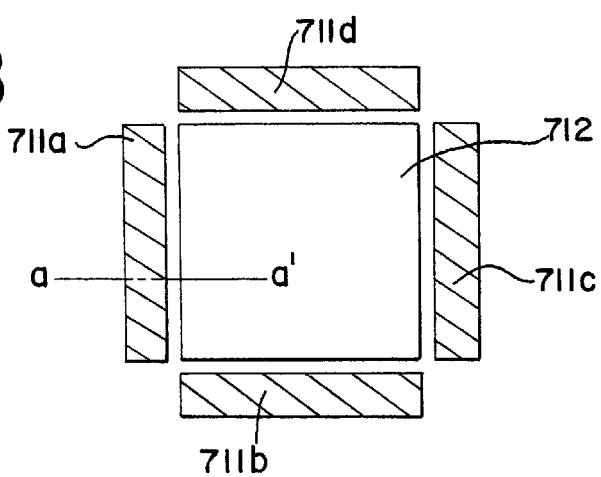

Next, FIG. 7B is also a top plan view. Unlike the structure in FIG. 7A, light shield portions 711a–711d are disposed in four places around an anode 712 as viewed from above. Owing to such a structure, each light shield portion can serve for adjacent pixels. Therefore, in a case where the number of pixels in a pixel portion increases to afford a high definition, the structure is effective in the point that the area of all light shield portions occupied in the pixel portion may be small.

Figure 7C:
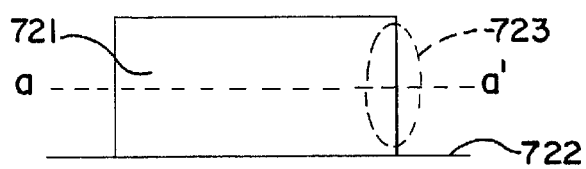

FIG. 7C shows the sectional structure of a light shield portion. The "sectional structure" termed here signifies the shape of a plane which appears when the light shield portion is cut perpendicularly to the sheet of the drawing along line a–a' indicated in FIG. 7A or 7B. Incidentally, the position a lies outside the anode 702 or 712, whereas the position a' lies inside the anode 702 or 712.

Referring to FIG. 7C, the light shield portion 721 is formed perpendicularly to an EL element forming surface 722, and it lies in touch with the peripheral part of the anode at its light-shielding surface 723.

Figure 7D:
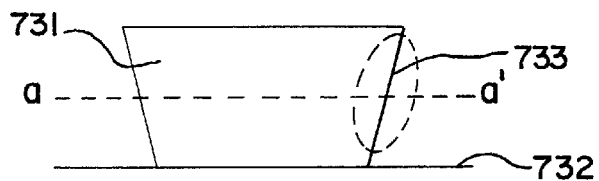

Next, referring to FIG. 7D, a light shield portion 731 is formed in a shape flared from an EL element forming surface 732, and it lies in touch with the peripheral part of the anode at its light-shielding surface 733.

Figure 7E:
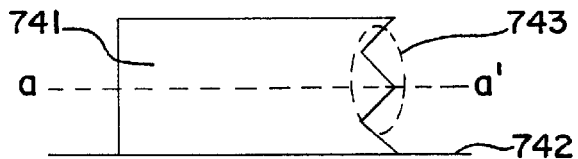

Next, referring to FIG. 7E, a light shield portion 741 is formed in a depicted rugged shape on an EL element forming surface 742, and it lies in touch with the peripheral part of the transparent electrode at its light-shielding surface 743.

Incidentally, any of the constructions of this embodiment can be employed in optional combination with the construction of Embodiment 1 or Embodiment 2.

[Embodiment 4]

In this embodiment, the light shield portion formed of the drain wiring line as explained in Embodiment 1 is not provided, but the second interlayer insulating film provided after the formation of the transparent electrode as explained in Embodiment 1 is formed of a light-shielding insulating material and is caused to function as a light shield portion. Incidentally, this embodiment will be described on a case where a transparent electrode is an anode, while a non-transparent electrode is a cathode.

By the way, the "light-shielding insulating material" in this embodiment should preferably be a material such as polyimide, polyamide, an acrylic resin or BCB (benzocyclobutene) which contains a black pigment or carbon.

Figure 8:
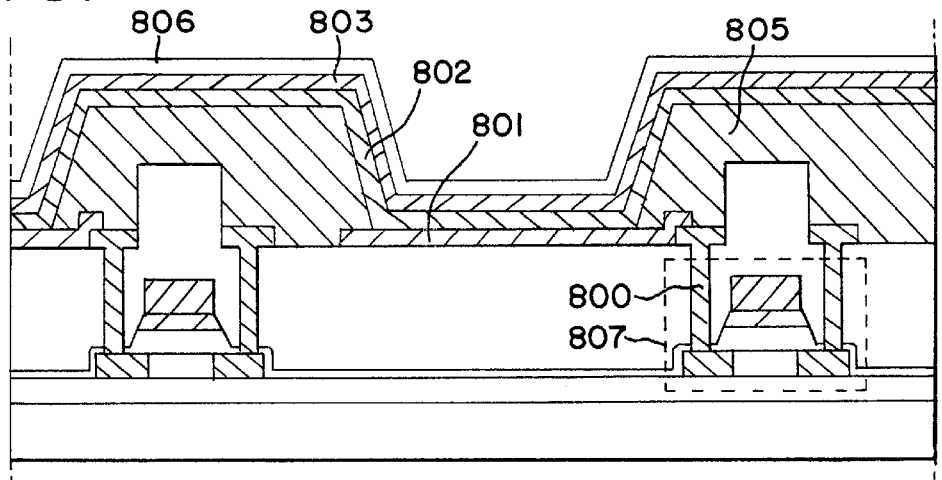
FIG. 8 is a view showing a sectional structure in the vicinity of the pixel of a light-emitting device in still another embodiment.

A structure in this embodiment is shown in FIG. 8. Here, a drain wiring line 800 can be formed thin unlike that in Embodiment 1. Thus, the drain wiring line in this embodiment is easily overlapped by the transparent electrode 801. Moreover, since the light shield portion is not intentionally provided, the higher definition of a pixel portion can be coped with.

After the formation of the anode 801, the second interlayer insulating film 805 of light shielding property is provided. Further, an EL layer 802, the cathode 803 and a passivation film 806 are stacked. Then, the structure of this embodiment is finished up. By the way, a current controlling TFT 807 shown here may be the same as explained in Embodiment 1.

Incidentally, the construction of this embodiment can be employed in optional combination with the construction of any of Embodiments 1–3.

[Embodiment 5]

This embodiment will be described with reference to FIGS. 9 and 10 on a case where the invention is performed for a TFT which is structurally different from that explained in Embodiment 1.

Figure 9A:
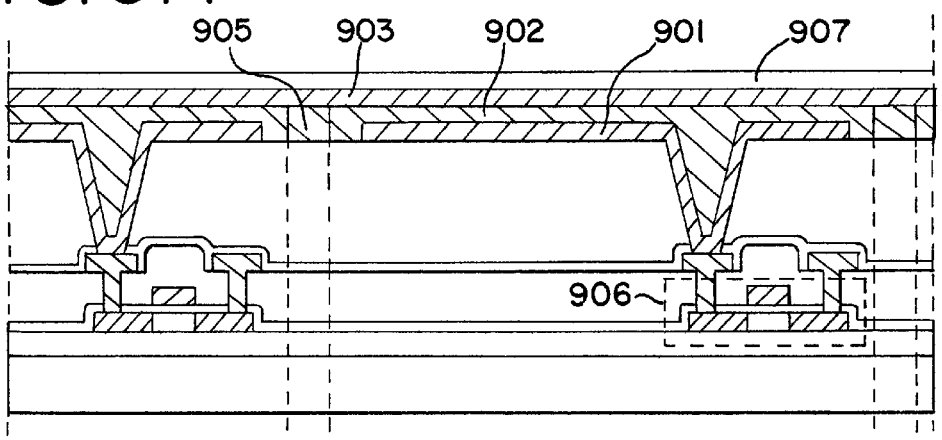
FIG. 9 is a view showing a sectional structure in the vicinity of the pixel of a light-emitting device in yet another embodiment.
Figure 9B:
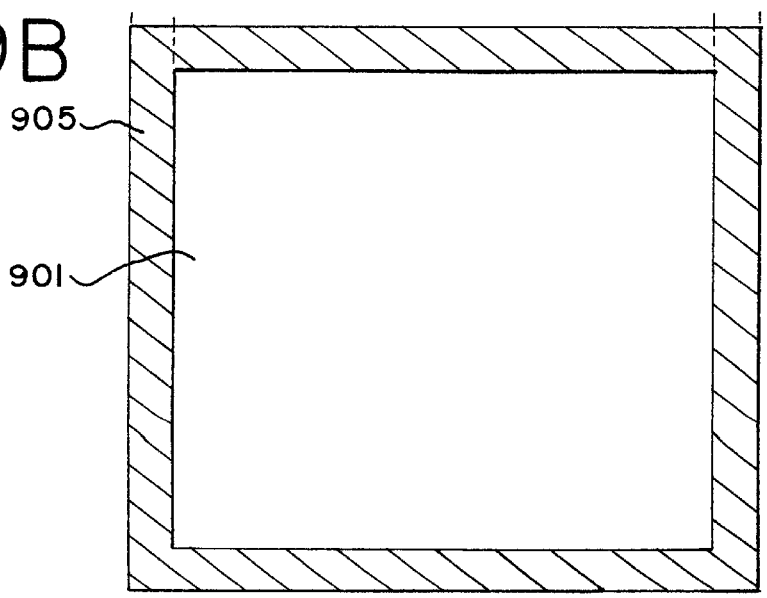

As shown in FIG. 9, the current controlling TFT 906 is formed on an insulating surface. By the way, whereas Embodiment 1 has mentioned the structure in which the wiring line for the connection between the current controlling TFT and the transparent electrode is formed after the formation of the first interlayer insulating film, this embodiment will be described on a structure obtained in such a way that the connection wiring line between the current controlling TFT and a transparent electrode is formed after the formation of a first interlayer insulating film, and that the transparent electrode is formed after the formation of a second interlayer insulating film. Besides, a method of fabricating a light-emitting device in this embodiment will be described in detail later. In addition, this embodiment will be described on a case where the transparent electrode is an anode, while a non-transparent electrode is a cathode.

After the formation of the anode 901 which is electrically connected to the current controlling TFT 906 as shown in FIG. 9, a light shield portion 905 is formed out of touch with the anode 901 by sputtering. A material of high reflectivity, such as Al, Ta, Nb, Mo or Ag, is preferable as the material of the light shield portion 905 on this occasion. In an example of this embodiment, the light shield portion 905 was formed using Ag.

Incidentally, the thickness of a film for forming the light shield portion 905 should preferably be set at 100 nm–800 nm, more preferably at 300 nm–600 nm. Besides, in this embodiment, the anode 901 and the light shield portion 905 need to be formed so as not to touch.

Here in this embodiment, the anode 901 is formed earlier, followed by the formation of the light shield portion 905, but either of the anode 901 and the light shield portion 905 may be formed earlier. Further, after the formation of the anode 901 and the light shield portion 905, an EL layer 902 and the cathode 903 are formed. Lastly, a passivation film 907 made of an insulating material is formed. Then, an EL module is completed.

Next, the structure of the EL module mentioned in this embodiment will be described in conjunction with a sectional structure in FIG. 10.

Figure 10:
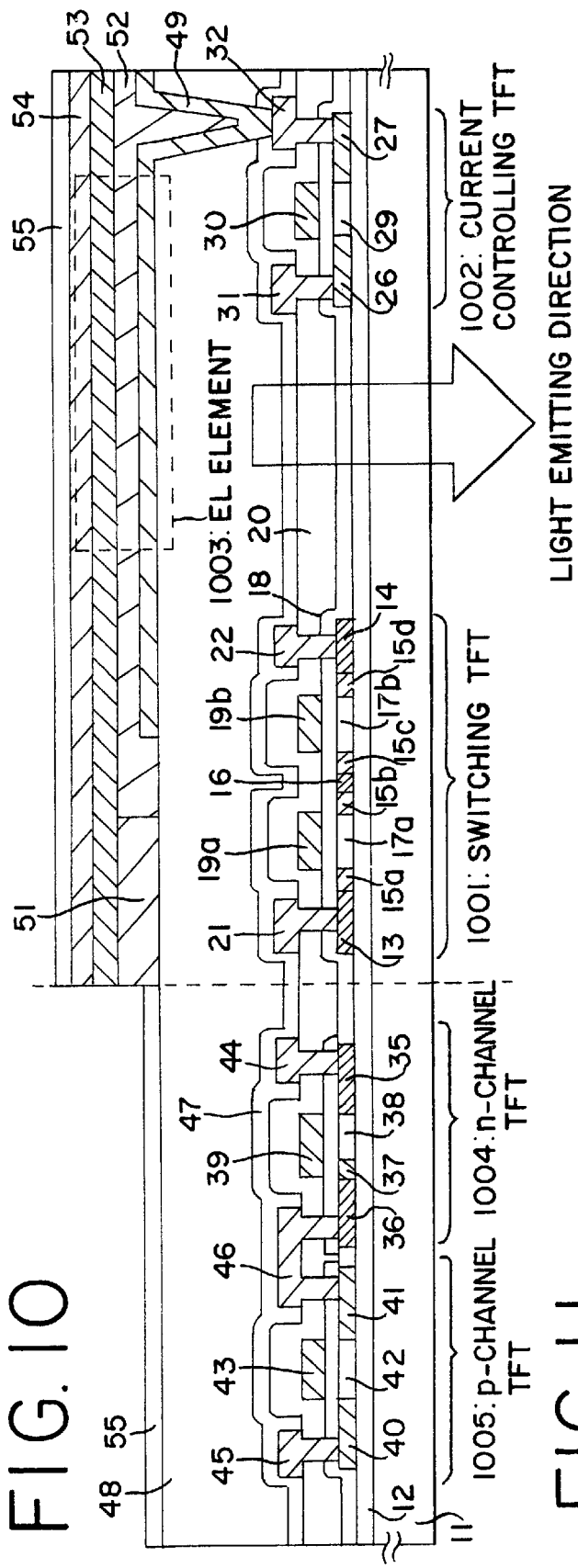
FIG. 10 is a view showing the sectional structure of the light-emitting device shown in FIG. 9.

Referring to FIG. 10, numeral 11 designates a substrate, and numeral 12 designates a base insulating film (herein below, termed "base film"). Usable as the substrate 11 is a light transmitting substrate, typically a glass substrate, a quartz substrate, a glass ceramics substrate or a crystallized glass substrate. The substrate, however, must endure the highest treatment temperature during the fabrication process of the light-emitting device. Further, a plastics substrate may well be employed if it is refractory enough to endure treatment temperatures in this embodiment.

Besides, the base film 12 is effective especially in case of employing a substrate which contains mobile ions, or a substrate which has an electrically conductive property. This base film 12 need not be provided on the quartz substrate. An insulating film containing silicon may be employed as the base film 12. By the way, in this specification, the "insulating film containing silicon" signifies an insulating film in which oxygen or nitrogen is contained at a predetermined proportion relative to silicon, concretely a silicon oxide film, a silicon nitride film, a silicon oxynitride film (indicated by $SiO_xN_y$ where letters x and y denote arbitrary integers), or the like.

Numeral 1001 designates a switching TFT, which is formed of an n-channel TFT, but which may well be replaced with a p-channel TFT. Besides, numeral 1002 designates a current controlling TFT. FIG. 10 illustrates a case where the current controlling TFT 1002 is formed of a p-channel TFT. In this case, the drain electrode of the current controlling TFT 1002 is connected to the anode of an EL element. In contrast, in a case where the current controlling TFT 1002 is formed of an n-channel TFT, the gate electrode thereof is connected to the cathode of the EL element.

In general, since an n-channel TFT has a field effect mobility higher than that of a p-channel TFT, it exhibits a higher operating speed and permits a great current to flow more easily. Besides, in causing the same quantity of current to flow, the n-channel TFT can be made smaller in size.

In the invention, however, the switching TFT and the current controlling TFT need not be restricted to the n-channel TFTs, but both or either of them can be formed of the p-channel TFTs or TFT.

The switching TFT 1001 is formed having an active layer which includes a source region 13, a drain region 14, LDD regions 15a–15d, an isolation region 16 and channel forming regions 17a, 17b; a gate insulating film 18; gate electrodes 19a, 19b; a first interlayer insulating film 20; a source wiring line 21; and a drain wiring line 22. Incidentally, the gate insulating film 18 or the first interlayer insulating film 20 may be common to all TFTs overlying the substrate 11, or it may well be divided or separated in accordance with circuits or elements.

Besides, the switching TFT 1001 has a so-called "double-gate structure" in which the gate electrodes 19a, 19b are electrically connected. Of course, it is not restricted to the double-gate structure, but it may well have any so-called "multigate structure" (a structure which includes an active layer having at least two channel forming regions connected in senes) such as triple-gate structure.

The multigate structure is very effective for lowering an OFF current. When the OFF current of the switching TFT 1001 is set sufficiently low, a capacitance required for a capacitor (not shown) can be decreased accordingly. That is, the occupation area of the capacitor can be made small. Therefore, the multigate structure is also effective for enlarging the effective light emission area of the EL element.

Further, in the switching TFT 1001, the LDD regions 15a–15d are disposed so as not to be overlapped by the gate electrodes 19a, 19b through the gate insulating film 18. Such a structure is very effective for lowering the OFF current. Besides, the length (width) of each of the LDD regions 15a–14d may be set at 2.0 μm–12.0 μm, typically 6.0 μm–10 μm.

Incidentally, it is more preferable for lowering the OFF current that an offset region (a region which is made of a semiconductor layer having the same composition as that of the channel region, and to which a gate voltage is not applied) is interposed between the channel forming region and the LDD region. Besides, in the case of the multigate structure having at least two gate electrodes, the isolation region 16 (the region which is doped with the same impurity element at the same concentration as those of the source region 13 or drain region 14) interposed between the channel forming regions 17a, 17b is effective for lowering the OFF current.

Next, the current controlling TFT 1002 is formed having a source region 26, a drain region 27, a channel forming region 29, the gate insulating film 18, a gate electrode 30, the first interlayer insulating film 20, a source wiring line 31 and a drain wiring line 32. Incidentally, the gate electrode 30 has a single-gate structure, but it may well have a multigate structure.

Besides, the drain region of the switching TFT is connected to the gate of the current controlling TFT. Concretely, the gate electrode 30 of the current controlling TFT 1002 is electrically connected with the drain region 14 of the switching TFT 1001 through the drain wiring line (which can also be called the "connection wiring line") 22.

From the viewpoint of increasing the quantity of current permitted to flow, it is also effective to make the active layer (especially the channel forming region) of the current controlling TFT 1002 thick (preferably 50 nm–100 nm, more preferably 60 nm–80 nm). To the contrary, in the case of the switching TFT 1001, from the viewpoint of decreasing the OFF current, it is also effective to make the active layer (especially the channel forming regions) thin (preferably 20 nm–50 nm, more preferably 25 nm–40 nm).

Although the structures of the TFTs disposed within a pixel have been explained above, driver circuits are simultaneously formed on this occasion. A CMOS circuit which is a basic unit for forming the driver circuits, is shown in FIG. 10.

In the construction of FIG. 10, the n-channel TFT 1004 of the CMOS circuit is employed as a TFT having a structure which mitigates hot carrier injection with an operating speed prevented from lowering to the utmost. Incidentally, the expression "driver circuits" here signifies a data signal driving circuit and a gate signal driving circuit. Of course, it is also possible to form other logic circuits (a level shifter, an A/D converter, a signal dividing circuit, etc.).

The active layer of the n-channel TFT 1004 includes a source region 35, a drain region 36, an LDD region 37 and a channel forming region 38, and the LDD region 37 is overlapped by a gate electrode 39 through the gate insulating film 18. In this specification, the LDD region 37 is also termed as the "Lov region".

The formation of the LDD region 37 on only a drain region side is intended to prevent the operating speed from lowering. Besides, an OFF current value need not be seriously cared about for the n-channel TFT 1004, but importance had better be attached rather to the operating speed. Accordingly, the LDD region 37 should desirably be entirely overlapped by the gate electrode 39 so as to lessen a resistance component to the utmost. That is, so-called "offset" should be avoided.

Besides, deterioration ascribable to hot carrier injection is hardly cared about for the p-channel TFT 1005 of the CMOS circuit, and any LDD region need not be especially provided therefor. Accordingly, the active layer of the TFT 1005 includes a source region 40, a drain region 41 and a channel forming region 42, and it is overlaid with the gate insulating film 18 and a gate electrode 43. Of course, it is also possible to take a measure against hot carriers by providing an LDD region likewise to that of the n-channel TFT 1004.

In addition, the n-channel TFT 1004 and the p-channel TFT 1005 are covered with the first interlayer insulting film 20 and are respectively formed with source wiring lines 44, 45. Also, both the TFTs are electrically connected by a drain wiring line 46. Besides, a first passivation film 47 is formed on the source and drain wiring lines.

Further, numeral 48 designates a second interlayer insulating film, which has a function as a flattening film for nullifying stepped parts formed by the TFTs. Preferable as the second interlayer insulating film 48 is an organic resin film, which may be made of polyimide, polyamide, an acrylic resin, BCB (benzocyclobutene) or the like. Such an organic resin film has the advantages that it is easy of forming a good flat surface, and that its relative permittivity is low. Since an EL layer is very susceptible to ruggedness, the stepped parts ascribable to the TFTs should desirably be absorbed most by the second interlayer insulating film 48. Besides, the material of low relative permitivity should desirably be disposed thick in order to diminish a parasitic capacitance which is formed between the cathode of the EL element 1003 and a gate wiring line or a data wiring line. Accordingly, the thickness of the second interlayer insulating film 48 should preferably be set at 0.5 $\mu$m–5 $\mu$m (more preferably, at 1.5 $\mu$m–2.5 $\mu$m).

Subsequently, a light shield portion 51 is formed by patterning. A material for forming the light shield portion 51 should preferably be one whose reflectivity is preferably at least 60%, more preferably at least 80%, within the visible light region of radiation. Concretely, the material is Ag, Al, Ta, Nb, Mo, Cu, Mg, Ni or Pb. In this embodiment, an Al film is formed to a thickness of 500 nm and is thereafter patterned, whereby the light shield portion 51 is disposed at a position which does not reach the peripheral part of the pixel.

Besides, numeral 49 designates an anode formed of an oxide conductive film (the anode of the EL element 1003). After a contact hole is provided in the second interlayer insulating film 48, the anode 49 is formed so as to be connected to the drain wiring line 32 of the current controlling TFT 1002 in the hole provided.

The EL layer 52 is disposed on the anode 49. The EL layer 52 is formed as a single-layer or a multilayer structure, and it attains a higher light emission efficiency with the multilayer structure. In general, the multilayer structure is formed by stacking a hole injecting layer/hole transporting layer/ light emitting layer/electron transporting layer in succession on the transparent electrode 49, but it may well be formed by stacking a hole transporting layer/light emitting layer/ electron transporting layer or a hole injecting layer/hole transporting layer/light emitting layer/electron transporting layer/electron injecting layer. In the invention, any known structure may be employed, and the EL layer 52 may well doped with a fluorescent pigment or the like.

Usable as an organic EL material is any of materials disclosed in, for example, U.S. Patents or Official Gazettes of Japanese Patent Application Laid-open as follows: U.S. Pat. Nos. 4,356,429, 4,539,507, 4,720,432, 4,769,292, 4,885,211, 4,950,950, 5,059,861, 5,047,687, 5,073,446, 5,059,862, 5,061,617, 5,151,629, 5,294,869, 5,294,870, Official Gazette of Japanese Patent Application Laid-open No. 10-189252, Official Gazette of Japanese Patent Application Laid-open No. 8-241048, Official Gazette of Japanese Patent Application Laid-open No. 8-78159.

Incidentally, the colored display schemes of light-emitting devices are broadly classified into four, a scheme wherein three sorts of EL elements corresponding to R (red), G (green) and B (blue) are formed; a scheme wherein EL elements emitting white light are combined with color filters; a scheme wherein EL elements emitting blue or bluish green light are combined with a fluorescent substance (fluorescent color conversion medium: CCM); and a scheme wherein EL elements corresponding to R, G and B are stacked with a transparent electrode used as a cathode.

The cathode 53 of the EL element 1003 is disposed on the EL layer 52. Usable for the cathode 53 is a material which contains magnesium (Mg), lithium (Li) or calcium (Ca) of small work function. Preferably, an electrode made of MgAg (a material in which Mg and Ag are mixed at Mg:Ag=10:1) may be employed as the cathode 53. Alternatively, an MgAgAl electrode, an LiAl electrode or an LiFAl electrode is mentioned.

The cathode 53 should desirably be formed continuously to the formation of the EL layer 52 without exposing the resulting structure to the atmospheric air. The reason therefor is that the state of the interface between the cathode 53 and the EL layer 52 affects the light emission efficiency of the EL element 1003 greatly. By the way, in this embodiment, a light emitting element which is constituted by the anode 49, EL layer 52 and cathode 53 is called the "EL element 1003".

A stacked body consisting of the EL layer 52 and the cathode 53 needs to be formed for each individual pixel. In this regard, since the EL layer 52 is very intolerant of moisture, conventional photolithography cannot be employed. Accordingly, the EL layers 52 should preferably be formed at selected parts in accordance with a vapor growth process such as vacuum evaporation, sputtering or plasma CVD, by employing a physical mask member such as metal mask.

Incidentally, ink jetting, screen printing or the like can also be employed as a method for forming the EL layers 52 at the selected parts.

Besides, numeral 54 designates a protective electrode, which serves to protect the cathode 53 from moisture etc. in the exterior and simultaneously to connect the cathodes 53 of the pixels. The protective electrode 54 should preferably be formed of a material of low resistance, including aluminum (Al), copper (Cu) or silver (Ag). The heat radiation effect of moderating the heat generation of the EL layer 52 can also be expected of the protective electrode 54. Besides, it is effective to form the protective electrode 54 continuously to the formation of the EL layer 52 and the cathode 53 without exposing the resulting structure to the atmospheric air.

Further, a passivation film 55 made of an insulating material is formed on the protective electrode 54. Then, an EL module in this embodiment is completed.

Incidentally, the construction of this embodiment can be employed in optional combination with the construction of any of Embodiments 1–4.

[Embodiment 6]

In this embodiment, a case of employing an EL module whose TFT structure is different from that explained in Embodiment 5 will be described with reference to FIG. 11. In other words, this embodiment will be described on an example which employs TFTs of bottom gate type. By the way, in this embodiment, it is structurally impossible to utilize a wiring line as a light shield portion, and hence, the light shield portion is disposed anew. Besides, this embodiment will be described on a case where a transparent electrode is an anode, while a non-transparent electrode is a cathode.

Figure 11:
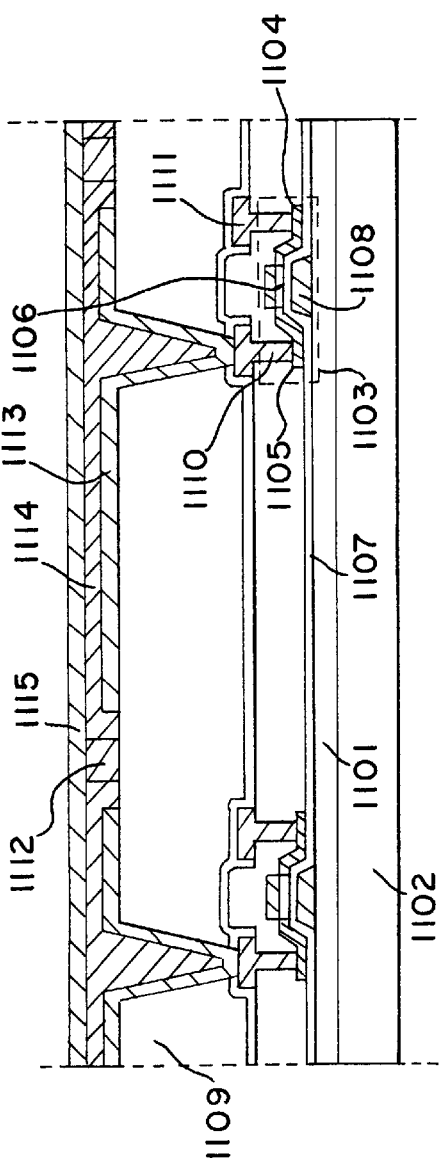
FIG. 11 is a view showing a sectional structure in the vicinity of the pixel of a light-emitting device in a further embodiment.

Of the pixel TFTs, only the current controlling TFT is illustrated in FIG. 11. Numeral 1101 designates a substrate, and numeral 1102 designates a base insulating film (herein below, termed "base film"). Usable as the substrate 1101 is a light transmitting substrate, typically a glass substrate, a quartz substrate, a glass ceramics substrate or a crystallized glass substrate. The substrate, however, must endure the highest treatment temperature during the fabrication process of a light-emitting device.

Besides, the base film 1102 is effective especially in case of employing a substrate which contains mobile ions, or a substrate which has an electrically conductive property. This base film 1102 need not be provided on the quartz substrate. An insulating film containing silicon may be employed as the base film 1102. By the way, in this specification, the "insulating film containing silicon" signifies an insulating film in which oxygen or nitrogen is contained at a predetermined proportion relative to silicon, concretely a silicon oxide film, a silicon nitride film, a silicon oxynitride film (indicated by $SiO_xN_y$ where letters x and y denote arbitrary integers), or the like.

Numeral 1103 designates the current controlling TFT, which is formed of a p-channel TFT. In a case where the light emission of an EL element is directed to the lower surface of the substrate (the surface thereof on which the TFTs and an EL layer are not provided), it is preferable to employ a construction in which the switching TFT is formed of an n-channel TFT, while the current controlling TFT is formed of the p-channel TFT. The invention, however, is not restricted to this construction. Each of the switching TFT and the current controlling TFT may be either the n-channel TFT or the p-channel TFT.

The current controlling TFT 1103 is formed having an active layer which includes a source region 1104, a drain region 1105 and a channel forming region 1106; a gate insulating film 1107; a gate electrode 1108; a first interlayer insulating film 1109; and a wiring line (1) 1110 as well as a wiring line (2) 1111.

Besides, although not shown, the drain region of the switching TFT is connected to the gate electrode 1108 of the current controlling TFT 1103. Concretely, the gate electrode 1108 of the current controlling TFT 1103 is electrically connected with the drain region of the switching TFT (not shown) through a drain wiring line (not shown). Incidentally, the gate electrode 1108 has a single-gate structure, but it may well have a multigate structure. In addition, the wiring line (2) 1111 of the current controlling TFT 1103 is connected to a current supply line (not shown).

The current controlling TFT 1103 is an element which is for controlling the quantity of current to be injected into the EL element, and through which a comparatively large amount of current flows. Therefore, the channel width (W) of the current controlling TFT 1103 should preferably be designed greater than that of the switching TFT. Besides, the channel length (L) of the current controlling TFT 1103 should preferably be designed somewhat great in order to prevent an excess current from flowing through this TFT. Desirably, the current flowing through the TFT is set at 0.5 $\mu A$–2 $\mu A$ (preferably at 1 $\mu A$–1.5 $\mu A$) per pixel.

Further, the deterioration of the current controlling TFT 1103 may well be suppressed by thickening the active layer (especially, the channel forming region) of this TFT (preferably to 50 nm–100 nm, more preferably to 60 nm–80 nm).

Thus far described is the point of structural difference between the TFTs mentioned in Embodiment 5 and the TFTs of inverse stagger type. Thenceforth, the invention can be performed in the same way as in Embodiment 5.

That is, after the formation of the current controlling TFT 1103, the first interlayer insulating film 1109 and a second interlayer insulating film are formed, and the anode 1113 electrically connected with the current controlling TFT 1103 is formed. Besides, after the formation of the anode 1113, a light shield portion 1112 is formed.

Concretely, a material of high reflectivity, such as Al, Ta, Nb, Mo or Ag is preferable as a material which is employed for the light shield portion 1112. Incidentally, the "material of high reflectivity" in this specification signifies a material whose reflectivity within the visible light region of radiation is preferably at least 60%, more preferably at least 80%.

Besides, in case of employing a material which has the function of intercepting light, a material of low transmission factor should desirably be selected.

Incidentally, the light shield portion 1112 is formed in such a way that, after a film is formed by sputtering, it is patterned.

Subsequently, the EL layer 1114 and the cathode 1115 are formed. Further, a passivation film made of an insulating material is formed on the cathode 1115. Thus, the EL module having the inverse stagger type TFT structure can be formed.

Incidentally, the construction of this embodiment can be employed in optional combination with the construction of any of Embodiments 1–5.

[Embodiment 7]

In this embodiment, the method is described that EL module having a light shielding portion and a function of a light shielding is made to complete as a light-emitting device. Further in this embodiment, the case that the transparent electrode is an anode and non-transparent electrode is a cathode is explained.

FIG. 12A is a top view representing the state after the sealing of the EL element, and FIG. 12B is a cross sectional view along a line A–A' of FIG. 12A. Reference numeral 1201 shown by a dotted line denotes a source side driver circuit, reference numeral 1202 denotes a pixel portion, and reference numeral 1203 denotes a gate side driver circuit. Also, reference numeral 1204 denotes a cover member, reference numeral 1205 denotes a first sealing member, and reference numeral 1206 denotes a second sealing member. A sealing member 1207 is provided in the inside surrounded by the first sealing member 1205.

Note that, reference numeral 1208 denotes a wiring for transmitting signals inputted to the source side driver circuit 1201 and the gate side driver circuit 1203. The wiring 1208 receives a video signal and a clock signal from a FPC (flexible printed circuit) 1209 as an external input terminal. In FIG. 12A, although only the FPC is shown, a printed wiring board (PWB) may be attached to the FPC. The EL display device in this specification includes not only the main body of the EL display device but also the EL display device to which the FPC or the PWB is attached.

Next, the cross sectional structure will be described using FIG. 12B. The pixel portion 1202 and the gate side driver circuit 1203 are formed over a substrate 1210. The pixel portion 1202 is formed by a plurality of pixels each having a current control TFT 1211 and a plural pixels including the transparent electrode 1212 which is electrically connected with the drain region thereof. Also, the gate side driver circuit 1203 is formed using the CMOS circuit in which an n-channel type TFT 1213 and a p-channel type TFT 1214 are combined with each other (see FIG. 5).

Also, banks 1215 are formed in both ends of the anode 1212. An EL layer 1216 and a cathode 1217 of the EL element are formed on the anode 1212.

The cathode 1217 also functions as a wiring common to all pixels, and is electrically connected with the FPC 1209 through the connection wiring 1208. Further, all elements which are included in the pixel portion 1202 and the gate side driver circuit 1203 are covered with the cathode 1217 and a passivation film 1218.

Also, the cover member 1204 is adhered by the first sealing member 1205. Note that, in order to keep an interval between the cover member 1204 and the EL element, a spacer made of a resin film may be provided. Then, the inside of the first sealing member 1205 is filled with a sealing member 1207. Note that, it is preferred that epoxy resin is used as the first sealing member 1205 and the sealing member 1207. Also, it is desired that the first sealing member 1205 is a material to which moisture and oxygen are not penetrated as much as possible. Further, a material having a hygroscopic effect or a material having an oxidation inhibition effect may be contained in the sealing member 1207.

The sealing member 1207 provided to cover the EL element also functions as an adhesive for adhering the cover member 1204. Also, in this embodiment, FRP (fiberglass-reinforced plastics), PVF (polyvinylfluoride), Mylar, polyester, or acrylic can be used as a material of a plastic substrate composing the cover member 1204.

Also, after the adhering of the cover member 1204 using the sealing member 1207, the second sealing member 1206 is provided to cover side surfaces (exposed surfaces) of the sealing member 1207. In the second sealing member 1206, the same material as that of the first sealing member 1205 can be used.

By sealing the EL element in the filler 1207 using the method as described above, the EL element can be completely shut off from the outside, and it is possible to prevent a material which promotes oxidation of an organic material, such as moisture or oxygen the outside of the outside, from entering. Thus, it is possible to fabricate an EL display device with high reliability.

Further the structure of this embodiment can be used as freely combined with the structure of Embodiments 1 to 6.

[Embodiment 8]

The light-emitting device of the present invention, is a self light emitting type, therefore compared to a liquid crystal display device, it has excellent visible properties and is broad in an angle of visibility. Accordingly, the light-emitting device can be applied to a display portion in various electronic devices. For example, in order to view a TV program or the like on a large-sized screen, the light-emitting device in accordance with the present invention can be used as a display portion of a display having a diagonal size of 30 inches or larger (typically 40 inches or larger).

The display shown in this embodiment includes all kinds of displays to be used for displaying information, such as a display for a personal computer, a display for receiving a TV broadcasting program, a display for advertisement display. Moreover, the light-emitting device of the present invention can be used as a display portion of other various electric devices.

As other electronic equipments of the present invention there are: a video camera; a digital camera; a goggle type display (head mounted display); a navigation system; a sound reproduction device (a car audio stereo, an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk Player (DVD), and displays the images). In particular, in the case of the portable information terminal, use of the EL display device is preferable, since the portable information terminal that is likely to be viewed from a tilted direction is often required to have a wide viewing angle. Specific examples of those electronic equipments are shown in FIGS. 13A to 14C.

Figure 13A:
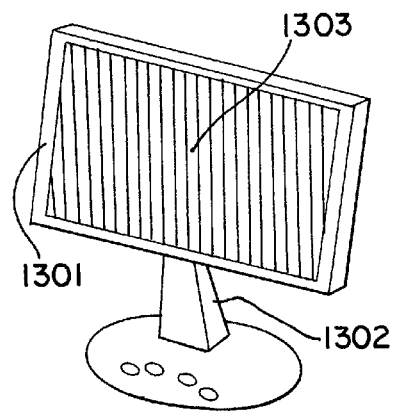
FIGS. 13A through 13F are views each showing an example of an electric equipment.

FIG. 13A shows an EL display containing a casing 1301, a support stand 1302, and a display portion 1303. The electronic device and the driving method of the present invention can be used as the display portion 1303. Such a light-emitting device is a self light emitting type so that a back light is not necessary. Thus, the display portion can be made thinner than that of a liquid crystal display.

Figure 13B:
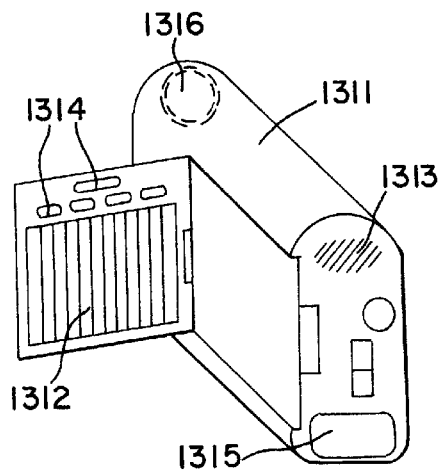

FIG. 13B shows a video camera, and contains a main body 1311, a display portion 1312, a sound input portion 1313, operation switches 1314, a battery 1315, and an image receiving portion 1316. The light-emitting device of the present invention can be used as the display portion 1312.

Figure 13C:
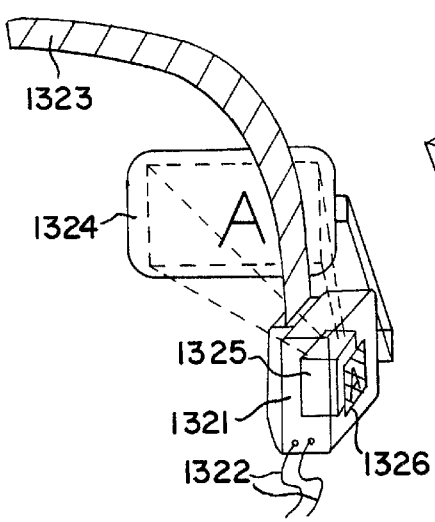

FIG. 13C shows a part of a head mounted EL display device (right handed side), and contains a main boy 1321, a signal cable 1322, a head fix band 1323, a display portion 1324, an optical system 1325 and a display device 1326. The light-emitting device of the present invention can be used as the display device 1326.

Figure 13D:
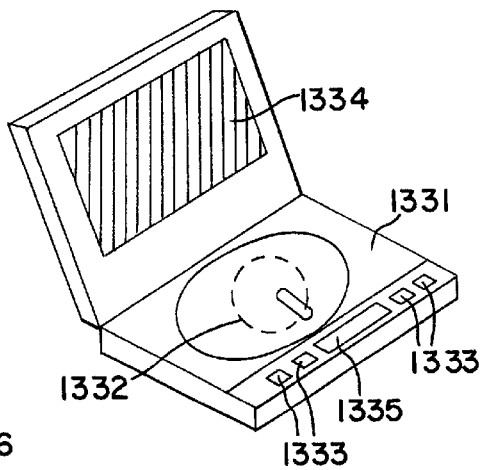

FIG. 13D is an image playback device equipped with a recording medium (specifically, a DVD playback device), and contains a main body 1331, a recording medium (such as a DVD and so forth) 1332, operation switches 1333, a display portion (a) 1334, and a display portion (b) 1335. The display portion (a) 1334 is mainly used for displaying image information. The display portion (b) 1335 is mainly used for displaying character information. The light-emitting device of the present invention can be used as the display portion (a) 1334 and as the display portion (b) 1335. Note that the image playback device equipped with the recording medium includes devices such as game machines.

Figure 13E:
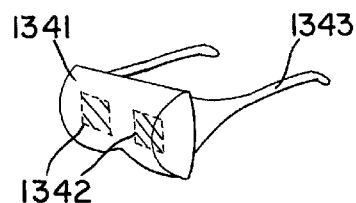

FIG. 13E shows a goggle type display device (a head mounted display device), and contains a main body 1341, a display portion 1342, and an arm portion 1343. The electronic device and the driving method of the present invention can be bused as the display portion 1342.

Figure 13F:
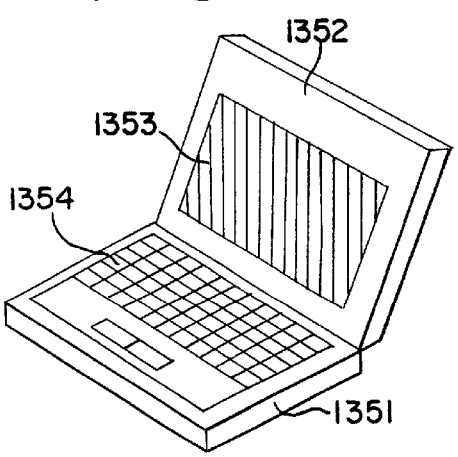

FIG. 13F is a personal computer, and contains a main body 1351, a casing 1352, a display portion 1353, and a keyboard 1354. The light-emitting device of the present invention can be used as the display portion 1353.

Note that if the luminance of EL material increases in the future, then it will become possible to use the light-emitting device of the present invention in a front type or a rear type projector by expanding and projecting light containing output image information with a lens or the like.

Figure 14A:
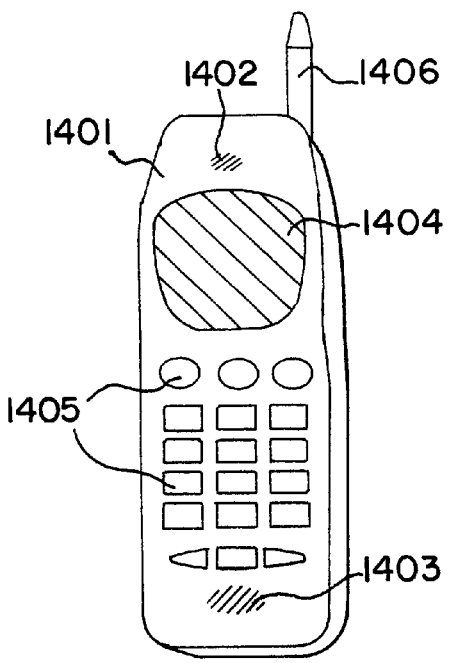
FIGS. 14A through 14C are views each showing an example of an electric equipment.

Further, the above electronic devices display often information transmitted through an electronic communication circuit such as the Internet and CATV (cable TV), and particularly situations of displaying moving images is increasing. The response speed of EL materials is so high that the light-emitting devices are good for display of moving image. FIG. 14A shows a portable telephone, and contains a main body 1401, a sound output portion 1402, a sound input portion 1403, a display portion 1404, operation switches 1405, and an antenna 1406. The light-emitting device of the present invention can be used as the display portion 1404. Note that by displaying white color characters in a black color background, the display portion 1404 can suppress the power consumption of the portable telephone.

Figure 14B:
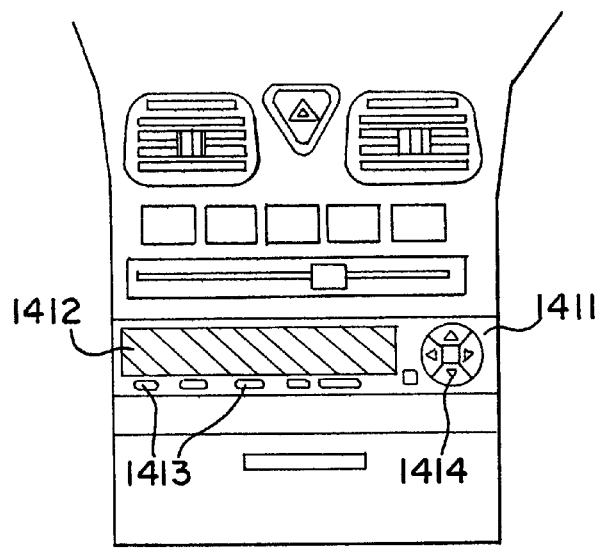

FIG. 14B shows a sound reproduction device, in a concrete term, a car audio stereo, and contains a main body 1411, a display portion 1412, and operation switches 1413 and 1414. The electronic device and the driving method of the present invention can be used as the display portion 1412. Further, a car mounting audio stereo is shown in this embodiment, but a fixed type audio playback device may also be used. Note that, the display portion 1414 can suppress the power consumption by displaying white color character in a black-color background, particularly in the portable sound reproduction device.

Figure 14C:
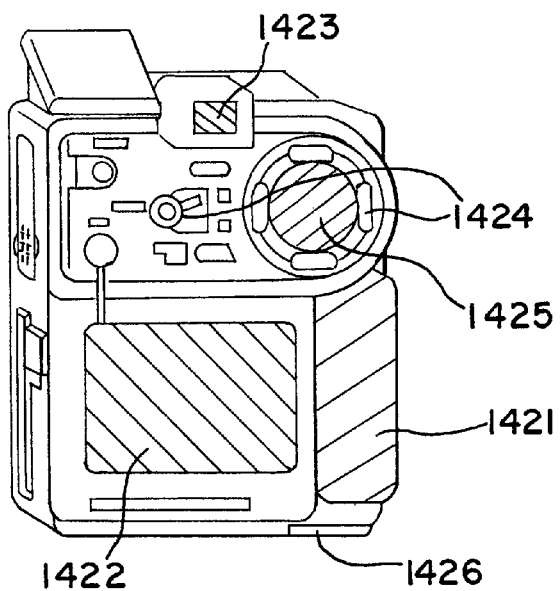

FIG. 14C shows a digital camera, and contains a main body (A) 1421, a display portion (A) 1422, an eye piece portion 1423, and an operation switches 1424, a display portion (B) 1425, a battery 1426. The light-emitting device of the present invention can be used as the display portion (A) 1422 and the display portion (B) 1425. Note that, in the case that the display portion (3) 1425 is used as the operation panel, the power consumption of the digital camera can suppress by displaying white color characters in a black color background.

In the case of the portable electronic device shown in this embodiment, the sensor portion is provided as a method of lowering the power consumption, which perceives the external light and functions to lower the brightness of display when it is used in the dark.

As described above, the application range of this invention is extremely wide, and it may be used for electric devices in various fields. Further, the electronic device of this embodiment may be obtained by freely combining the structures of first to seventh embodiments.

When a light shield portion is provided at the peripheral part of the transparent electrode of an EL element in accordance with the invention, light to exit from the transparent electrode toward the light shield portion is intercepted. Thus, it is possible to prevent the loss of light and the leakage of light to an adjacent pixel as are ascribable to the fact that light emitted in an EL layer escapes from the peripheral part of the transparent electrode, and it is permitted to sharply enhance the efficiency of deriving the light.

What is claimed is:

1. A light-emitting device comprising:
   a transparent electrode formed in contact with an insulating surface;
   an interlayer insulating film formed in contact with a portion of said insulating surface;
   an electro-luminescence layer formed on said transparent electrode and overlapped with said interlayer insulating film;
   a non-transparent electrode formed on said electro-luminescence layer; and
   a light shield portion formed in contact with said insulating surface.

2. A light-emitting device according to claim 1, wherein said light shield portion comprises an insulating film containing a pigment or carbon.

3. A light-emitting device according to claim 1, wherein said light shield portion comprises a conductive material.

4. A light-emitting device according to claim 1, wherein said light shield portion reflects light emitted in said electro-luminescence layer.

5. A light-emitting device according to claim 1, wherein said light-emitting device is incorporated in at least one selected from the group consisting of an EL display device, a sound reproduction device, an image playback device, a video camera, a head mount display, a personal computer, a digital camera, and a portable telephone.

6. A light-emitting device comprising:
   a transparent electrode formed in contact with an insulating surface;
   an interlayer insulating film formed in contact with a portion of said insulating surface;
   a light shield portion formed in contact with said insulating surface;
   an electro-luminescence layer formed on said transparent electrode and overlapped with said interlayer insulating film; and
   a non-transparent electrode formed on said electro-luminescence layer,
   wherein a part of said light shield portion is in contact with said transparent electrode.

7. A light-emitting device according to claim 6, wherein said light shield portion comprises an insulating film containing a pigment or carbon.

8. A light-emitting device according to claim 6, wherein said light shield portion comprises a conductive material.

9. A light-emitting device according to claim 6, wherein said light shield portion reflects light emitted in said electro-luminescence layer.

10. A light-emitting device according to claim 6, wherein said light-emitting device is incorporated in at least one selected from the group consisting of an EL display device, a sound reproduction device, an image playback device, a video camera, a head mount display, a personal computer, a digital camera, and a portable telephone.

11. A light-emitting device comprising:
    a plurality of transparent electrodes formed in contact with an insulating surface;
    an interlayer insulating film formed in contact with a portion of said insulating surface;
    an electro-luminescence layer formed on each of said transparent electrodes and overlapped with said interlayer insulating film;
    a non-transparent electrode formed on said electro-luminescence layer; and
    light shield portions formed in contact with said insulating surface.

12. A light-emitting device according to claim 11, wherein said light shield portions comprise an insulating film containing a pigment or carbon.

13. A light-emitting device according to claim 11, wherein said light shield portions comprise a conductive material.

14. A light-emitting device according to claim 11, wherein said light shield portions reflect light emitted in said electro-luminescence layer.

15. A light-emitting device according to claim 11, wherein said light-emitting device is incorporated in at least one selected from the group consisting of an EL display device, a sound reproduction device, an image playback device, a video camera, a head mount display, a personal computer, a digital camera, and portable telephone.

16. A light-emitting device comprising:
    a plurality of transparent electrodes formed in contact with an insulating surface;
    an interlayer insulating film formed in contact with a portion of said insulating surface;
    light shield portions formed in contact with said insulating surface;
    an electro-luminescence layer formed on each of said transparent electrodes and overlapped with said interlayer insulating film; and
    a non-transparent electrode formed on said electro-luminescence layer,
    wherein each of said light shield portions is in contact with said respectively corresponding transparent electrodes.

17. A light-emitting device according to claim 16, wherein said light shield portions comprise an insulating film containing a pigment or carbon.

18. A light-emitting device according to claim 16, wherein said light shield portions comprise a conductive material.

19. A light-emitting device according to claim 16, wherein said light shield portions reflect light emitted in said electro-luminescence layer.

20. A light-emitting device according to claim 16, wherein said light-emitting device is incorporated in at least one selected from the group consisting of an EL display device, a sound reproduction device, an image playback device, a video camera, a head mount display, a personal computer, a digital camera, and a portable telephone.

21. A light-emitting device comprising:
   a plurality of transparent electrodes formed in contact with an insulating surface;
   an interlayer insulating film formed in contact with a portion of said insulating surface;
   light shield portions formed in contact with said insulating surface;
   an electro-luminescence layer formed on each of said transparent electrodes and overlapped with said interlayer insulating film; and
   a non-transparent electrode formed in contact with said electro-luminescence layer,
   wherein each of said light shield portions is in contact with at least two of said transparent electrodes.

22. A light-emitting device according to claim 21, wherein said light shield portions comprise an insulating film containing a pigment or carbon.

23. A light-emitting device according to claim 21, wherein said light shield portions comprise a conductive material.

24. A light-emitting device according to claim 21, wherein said light shield portions reflect light emitted in said electro-luminescence layer.

25. A light-emitting device according to claim 21, wherein said light-emitting device is incorporated in at least one selected from the group consisting of an EL display device, a sound reproduction device, an image playback device, a video camera, a head mount display, a personal computer, a digital camera, and a portable telephone.

26. A light-emitting device comprising:
   a transparent electrode formed in contact with an insulating surface, and connected with a thin film transistor through a wiring line;
   an interlayer insulating film formed in contact with a portion of said insulating surface;
   an electro-luminescence layer formed on said transparent electrode and overlapped with said interlayer insulating film;
   a non-transparent electrode formed on said electro-luminescence layer; and
   a light shield portion formed in contact with said insulating surface.

27. A light-emitting device according to claim 26, wherein said light shield portion comprises an insulating film containing a pigment or carbon.

28. A light-emitting device according to claim 26, wherein said light shield portion comprises said wiring line.

29. A light-emitting device according to claim 26, wherein said light shield portion reflects light emitted in said electro-luminescence layer.

30. A light-emitting device according to claim 26, wherein said transparent electrode is an anode, and said non-transparent electrode is a cathode.

31. A light-emitting device according to claim 26, wherein said light shield portion comprises a metal material having a reflectivity of 60% or more.

32. A light-emitting device according to claim 26, wherein said light-emitting device is incorporated in at least one selected from the group consisting of an EL display device, a sound reproduction device, an image playback device, a video camera, a head mount display, a a personal computer, a digital camera, and a portable telephone.

33. A light-emitting device comprising:
   a transparent electrode formed in contact with an insulating surface, and connected with a thin film transistor through a wiring line;
   an interlayer insulating film formed in contact with a portion of said insulating surface;
   a light shield portion formed in contact with said insulating surface;
   an electro-luminescence layer formed on said transparent electrode and overlapped with said interlayer insulating film; and
   a non-transparent electrode formed on said electro-luminescence layer, wherein a part of said light shield portion is in contact with said transparent electrode.

34. A light-emitting device according to claim 33, wherein said light shield portion comprises an insulating film containing a pigment or carbon.

35. A light-emitting device according to claim 33, wherein said light shield portion comprises said wiring line.

36. A light-emitting device according to claim 33, wherein said light shield portion reflects light emitted in said electro-luminescence layer.

37. A light-emitting device according to claim 33, wherein said transparent electrode is an anode, and said non-transparent electrode is a cathode.

38. A light-emitting device according to claim 33, wherein said light shield portion comprises a metal material having a reflectivity of 60% or more.

39. A light-emitting device according to claim 33, wherein said light-emitting device is incorporated in at least one selected from the group consisting of an EL display device, a sound reproduction device, an image playback device, a video camera, a head mount display, a personal computer, a digital camera, and a portable telephone.

40. A light-emitting device having a plurality of pixels comprising:
   transparent electrodes formed in contact with an insulating surface, and connected with thin film transistors through wiring lines;
   an interlayer insulating film formed in contact with a portion of said insulating surface;
   an electro-luminescence layer formed on each of said transparent electrodes and overlapped with said interlayer insulating film;
   a non-transparent electrode formed on said electro-luminescence layer; and
   light shield portions formed in contact with said insulating surface.

41. A light-emitting device according to claim 40, wherein said plurality of pixels are adjacent to each other.

42. A light-emitting device according to claim 40, wherein said light shield portions comprise an insulating film containing a pigment or carbon.

43. A light-emitting device according to claim 40, wherein said light shield portions comprise said wiring lines.

44. A light-emitting device according to claim 40, wherein said light shield portions reflect light emitted in said electro-luminescence layer.

45. A light-emitting device according to claim 40, wherein said transparent electrodes are anodes, and said non-transparent electrode is a cathode.

46. A light-emitting device according to claim 40, wherein said light shield portions comprise a metal material having a reflectivity of 60% or more.

47. A light-emitting device according to claim 40, wherein said light-emitting device is incorporated in at least one selected from the group consisting of an El display device, a sound reproduction device, an image playback device, a video camera, a head mount display, a personal computer, a digital camera, and a portable telephone.

48. A light-emitting device having a plurality of pixels comprising:

transparent electrodes formed in contact with an insulating surface, and connected with thin film transistors through wiring lines;

an interlayer insulating film formed in contact with a portion of said insulating surface;

light shield portions formed in contact with said insulating surface;

an electro-luminescence layer formed on each of said transparent electrodes and overlapped with said interlayer insulating film; and a non-transparent electrode formed on said electro-luminescence layer, wherein each of said light shield portions is in contact with said respectively corresponding transparent electrodes.

49. A light-emitting device according to claim 48, wherein said plurality of pixels are adjacent to each other.

50. A light-emitting device according to claim 48, wherein said light shield portions comprise an insulating film containing a pigment or carbon.

51. A light-emitting device according to claim 48, wherein said light shield portions comprise said wiring lines.

52. A Light-emitting device according to claim 48, wherein said light shield portions reflect light emitted in said electro-luminescence layer.

53. A light-emitting device according to claim 48, wherein said transparent electrodes are anodes, and said non-transparent electrode is a cathode.

54. A light-emitting device according to claim 48, wherein said light shield portions comprise a metal material having a reflectivity of 60% or more.

55. A light-emitting device according to claim 48, wherein said light-emitting device is incorporated in at least one selected from the group consisting of an EL display device, a sound reproduction device, an image playback device, a video camera, a head mount display, a personal computer, a digital camera, and a portable telephone.

56. A light-emitting device having a plurality of pixels comprising:

transparent electrodes formed in contact with an insulating surface, and connected with thin film transistors through wiring lines;

an interlayer insulating film formed in contact with a portion of said insulating surface;

light shield portions formed in contact with said insulating surface;

an electro-luminescence layer formed on each of said transparent electrodes and overlapped with said interlayer insulating film; and a non-transparent electrode formed on said electro-luminescence layer, wherein each of said light shield portions is in contact with at least two of said transparent electrodes.

57. A light-emitting device according to claim 56, wherein said plurality of pixels are adjacent to each other.

58. A light-emitting device according to claim 56, wherein said light shield portions comprise an insulating film containing a pigment or carbon.

59. A light-emitting device according to claim 56, wherein said light shield portions comprise said wiring lines.

60. A light-emitting device according to claim 56, wherein said light shield portions reflect light emitted in said electro-luminescence layer.

61. A light-emitting device according to claim 56, wherein said transparent electrodes are anodes, and said non-transparent electrode is a cathode.

62. A light-emitting device according to claim 56, wherein said light shield portions comprise a metal material having a reflectivity of 60% or more.

63. A light-emitting device according to claim 56, wherein said light-emitting device is incorporated in at least one selected from the group consisting of an EL display device, a sound reproduction device, an image playback device, a video camera, a head mount display, a personal computer, a digital camera, and a portable telephone.

* * * * *